United States Patent [19]
Makita

[11] Patent Number: 5,981,974
[45] Date of Patent: Nov. 9, 1999

[54] SEMICONDUCTOR DEVICE AND METHOD FOR FABRICATING THE SAME

[75] Inventor: Naoki Makita, Nara, Japan

[73] Assignee: Sharp Kabushiki Kaisha, Osaka, Japan

[21] Appl. No.: 08/935,283

[22] Filed: Sep. 22, 1997

[30] Foreign Application Priority Data

Sep. 30, 1996 [JP] Japan ..................... 8-257883
Nov. 26, 1996 [JP] Japan ..................... 8-315286

[51] Int. Cl.$^6$ .................................................. H01L 29/94
[52] U.S. Cl. ........................... 257/72; 257/59; 257/66; 257/69
[58] Field of Search ..................... 257/59, 66, 69, 257/72

[56] References Cited

U.S. PATENT DOCUMENTS 5,403,762  4/1995  Takemura ........................ 437/40
5,583,347  12/1996  Misawa et al. ................... 257/72
5,589,406  12/1996  Kato et al. ....................... 437/21
5,789,763  8/1998  Kato et al. ....................... 257/72

FOREIGN PATENT DOCUMENTS 7-92501  4/1995  Japan .
8-201846  8/1996  Japan .

*Primary Examiner*—Valencia Martin-Wallace
*Attorney, Agent, or Firm*—Nixon & Vanderhye P.C.

[57] ABSTRACT

A semiconductor device includes a plurality of thin film transistors on a substrate having an insulating surface. A channel region of the thin film transistor comprises a crystalline Si film crystallized by a successive irradiation with a pulse laser beam in a scanning pitch P. A size Xs of the channel region in the scanning direction of the pulse laser beam and the scanning pitch P of the pulse laser beam have a relationship approximately equal to Xs=nP where n is an integer of 1 or more.

12 Claims, 15 Drawing Sheets

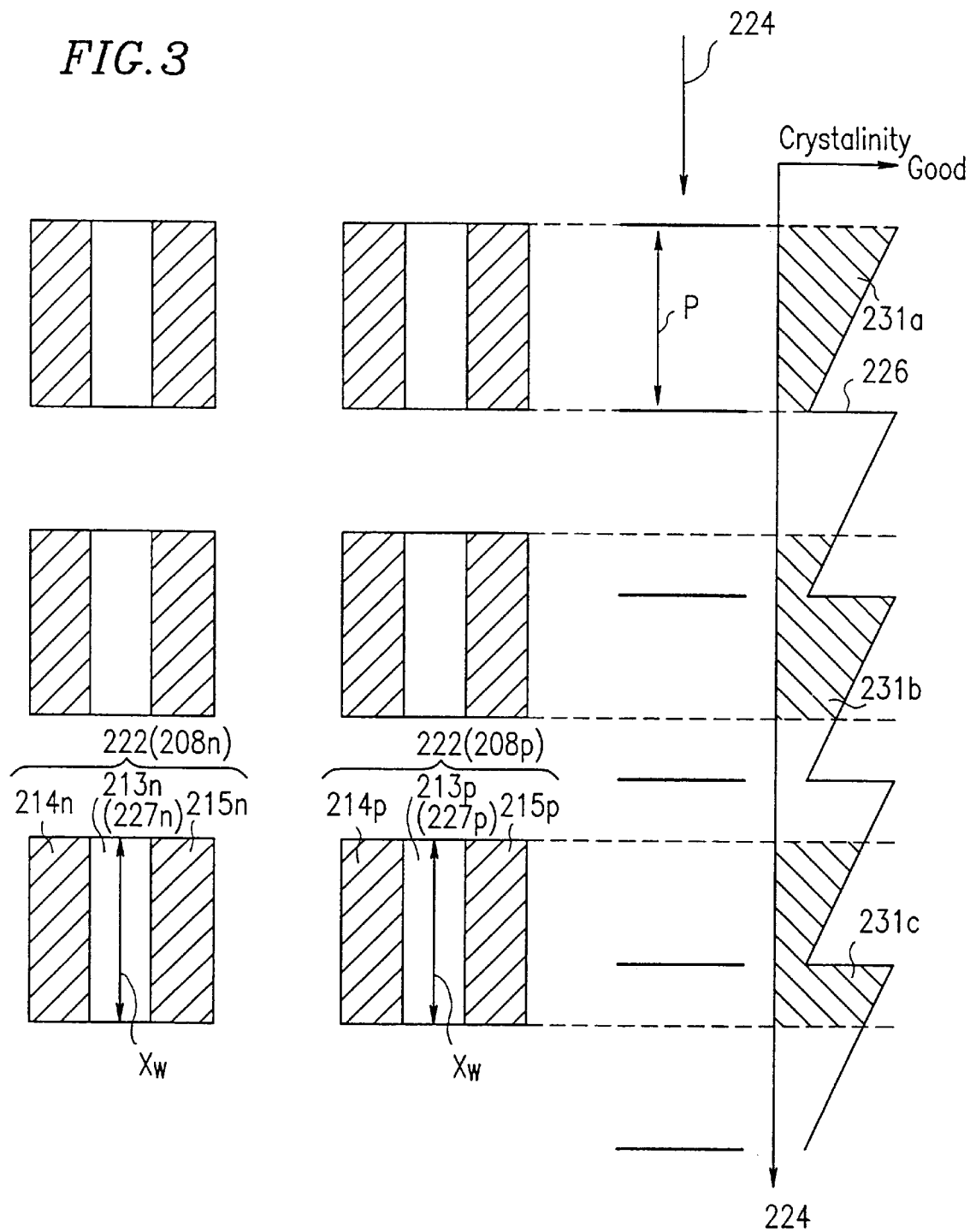

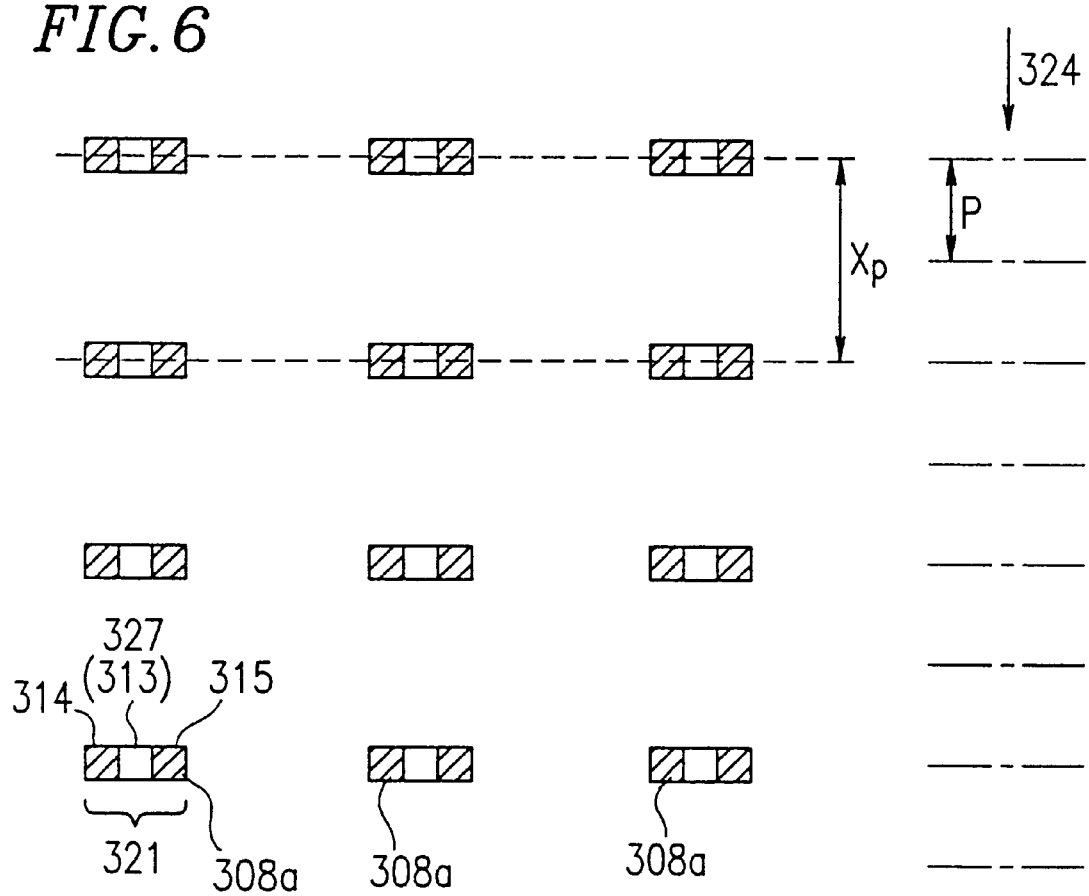

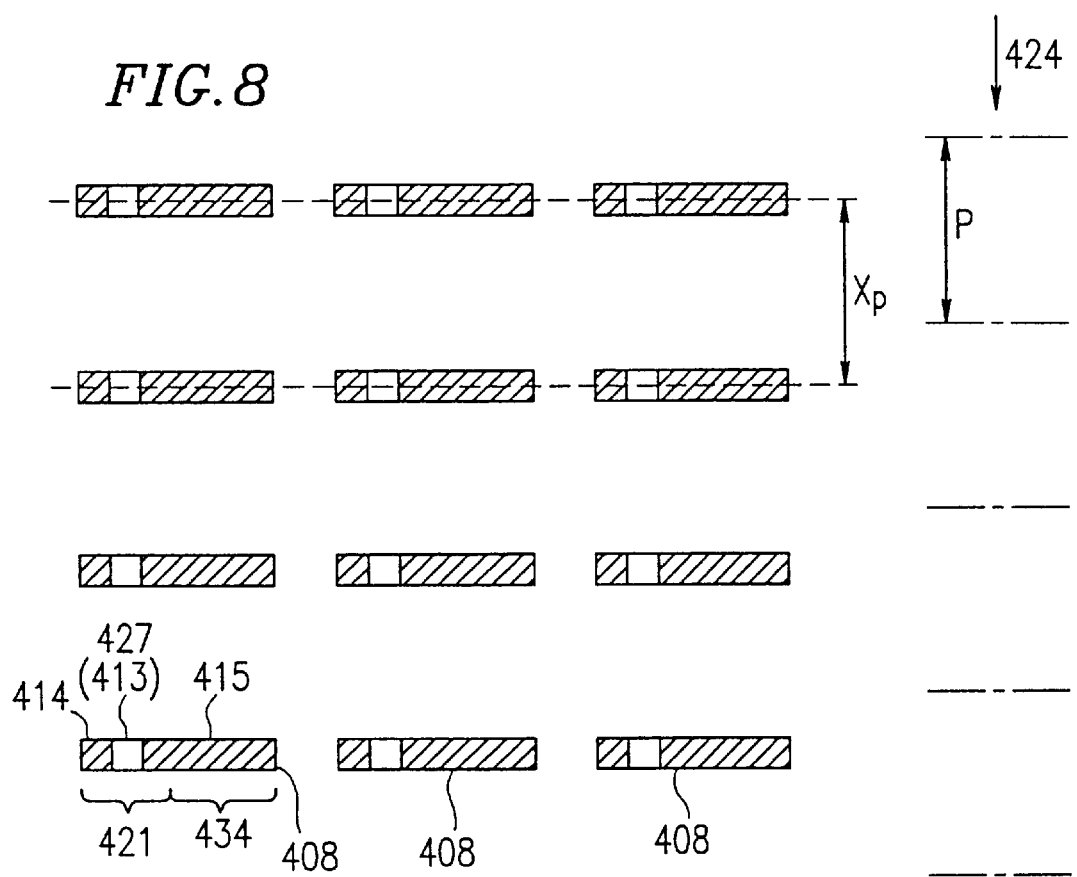

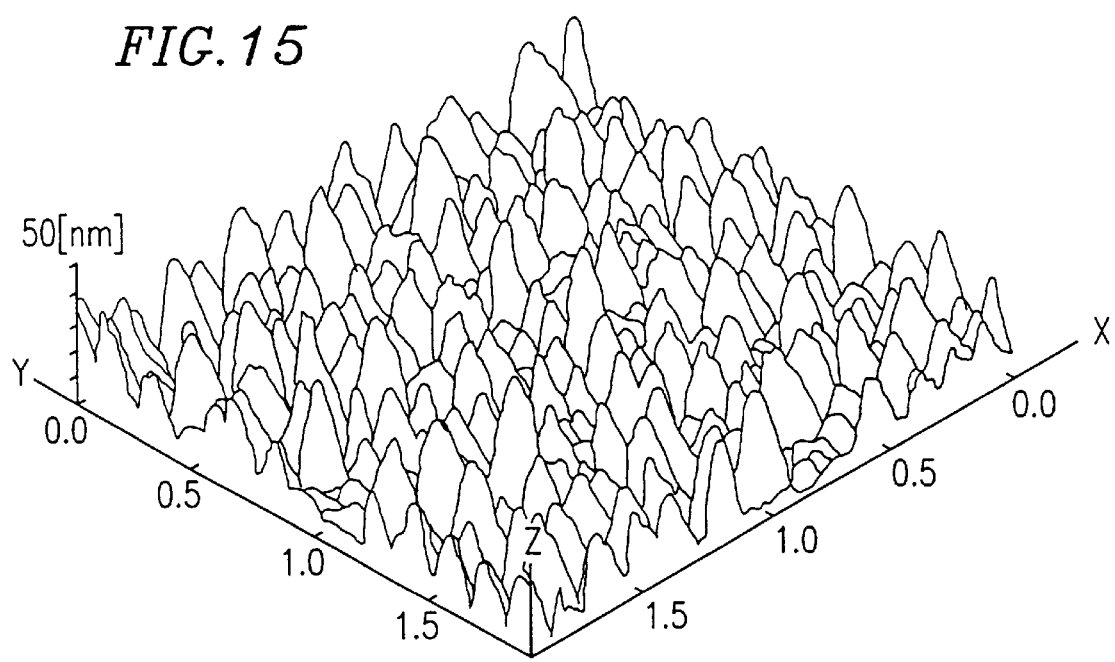

SEMICONDUCTOR DEVICE AND METHOD FOR FABRICATING THE SAME

BACKGROUND OF THE INVENTION

1. Field of the Invention

The present invention relates to a semiconductor device comprising a plurality of thin film transistors formed on a substrate having an insulating surface, and a method for fabricating the same. More particularly, the present invention relates to a semiconductor device using thin film transistors having a crystalline Si film as an active region, and a method for fabricating the same.

2. Description of the Related Art

Recently, attempts have been made to form a high performance semiconductor element (for example, thin film transistor (TFT)) on an insulating substrate such as glass, or an insulating film for the development of a large-scale high-resolution liquid crystal display device, a low-cost monolithic-type liquid crystal display device comprising a driver circuit formed on the substrate where TFTs are formed, a high-speed, high-resolution adherent-type image sensor, a three-dimensional IC, and the like. Generally, a thin film silicon (Si) semiconductor is used for the semiconductor elements of these devices.

The thin film Si semiconductor is roughly classified into an amorphous Si semiconductor (a-Si) and a crystalline Si semiconductor.

It is possible to readily prepare an amorphous Si semiconductor by a vapor phase method due to its lower preparation temperature. Therefore, since an a-Si semiconductor has excellent productivity, the a-Si semiconductor has been generally used in the art. However, an amorphous Si semiconductor has a drawback in that it has poorer electric characteristics such as conductivity than a crystalline Si semiconductor. For this reason, it is difficult to apply an amorphous Si semiconductor to a semiconductor device that requires higher speed characteristics. Therefore, a semiconductor device comprising a crystalline Si semiconductor has been strongly demanded for the development of a semiconductor device having higher speed characteristics. The crystalline Si semiconductor includes polycrystalline Si, microcrystalline Si, and amorphous Si containing a crystalline component, and the like.

A known method for obtaining such crystalline thin film Si semiconductors includes the following three methods: (1) a method directly forming a crystalline film; (2) a method including forming an amorphous semiconductor film, and crystallizing the amorphous semiconductor film by applying thermal energy; and (3) a method including forming an amorphous semiconductor film, and crystallizing the amorphous semiconductor film with laser beam (laser light) energy.

In the above-described method (1), it is difficult to obtain a crystalline Si having a large grain size, since the crystallization proceeds simultaneously with the film formation. Thus, in this method, the thickness of the Si film must be increased in order to obtain a crystalline Si having a large grain size. However, since the increase of the film thickness only provides approximately the same crystal grain size as the film thickness, it is principally impossible to prepare a Si film having good crystallinity according to this method. Furthermore, since a high film formation temperature of 600° C. or more is required for this method, a cost problem arises in that it is impossible to use a less expensive glass substrate.

The above-described method (2) requires a heating step at an elevated temperature of 600° C. or more for several tens of hours in the crystallization step. Therefore, this method suffers lower productivity. Since this method utilizes a solid phase crystallization, the resulting crystal grains extend parallel to the surface of the substrate, and some of them even have a grain size of several $\mu$m. However, because the grown crystal grains collide each other to form a grain boundary, the grain boundary acts as a trap level for carriers, and may be largely responsible for the reduction of the mobility of the TFT. Moreover, each crystal grain has a twin crystal structure which includes a large amount of crystal defects (which are called a twin crystal defect) even in a single crystal grain.

For these reasons, the above-described method (3) is now mainly used for obtaining crystalline Si semiconductors. Since this method utilizes a fusion solidification method to conduct the crystallization, each crystal grain provides excellent crystallinity. Furthermore, because the selection of the wavelength of the light to be irradiated allows for only the efficient heating of the Si film to be annealed, it is possible to prevent the heat damaging of the glass substrate which is located below the Si film. Moreover, since this method does not require a long-term treatment as used in the method (2), it provides excellent productivity. Since a high power excimer laser annealing device has recently been developed for this method, this method would be applicable to large area substrates.

A method for fabricating semiconductor elements utilizing the above-described method (3) is disclosed in, for example, Japanese Laid-open Patent Publications Nos. 8-201846 and 7-92501.

The method described in Japanese Laid-open Patent Publication No. 8-201846 includes irradiating a driver monolithic-type active matrix substrate for a liquid crystal display apparatus with a pulse laser beam (hereinafter referred to as a laser pulse) in a manner that portions of the laser pulse are overlapped so as to crystallize the Si film corresponding to the active region of the element. The driver monolithic-type active matrix substrate refers to a substrate wherein pixel TFTs and a driver portion which drives the pixel TFTs are simultaneously formed on the same substrate. In addition, this method further includes irradiating the Si film forming the TFT constituting the driver portion with the edge portion of the laser pulse. Furthermore, alternative method is employed which includes irradiating the substrate with the laser pulse in a manner that the width of the semiconductor thin film with respect to the scanning direction of the laser pulse is more than or integral times as much as a pitch of the laser pulse.

This method is the best among methods of crystallizing an Si film on an insulating substrate, but leaves a serious problem in the uniformity of the crystallinity. Specifically, a laser oscillator as a light source having an output power sufficient to irradiate a large area substrate has not yet been developed, and now the surface of the substrate is irradiated by successively scanning a beam having an area of approximately 100–200 mm². Therefore, as a matter of course, the non-uniformity of the crystallinity caused by the successive scanning of the laser has become a serious problem. Needless to say, the unevenness of the crystallinity directly relates to the characteristics of the semiconductor element, which causes the unevenness of the characteristics among the elements.

The following illustrates the scanning and irradiation of the laser pulse in more detail. Generally, the scanning and irradiation with the laser pulse is conducted in a manner as illustrated in FIG. 14A. FIG. 14A is a schematic view showing the energy distribution (energy profile) of the laser beam viewed from the cross section in the scanning direction. In FIG. 14A, the symbols 608 and P denote a scanning direction and scanning pitch of the laser pulse, respectively. The energy distribution of each of the laser pulses 601–605 scanned in the scanning pitch P generally provides a Gaussian shape having a beam width 607. The Si film is successively irradiated with the laser pulses in the order of 601, 602, 603, 604 and 605.

Certain points a, b, c and d in the Si film are irradiated a total of three times initially with a laser pulse 602, and subsequently with 603 and 604. That is, the overlapping amount of the laser pulse is set to be about 67% in FIG. 14A. The reason why the laser pulse is scanned and irradiated in a manner that a portion of each of the laser pulses 601–605 is overlapped is to increase the uniformity of the crystallinity of the Si film.

However, the biggest factor determining the crystallinity of the crystalline Si film to be crystallized by irradiation with the laser pulse is an initially irradiated laser pulse. This is due to the following reasons: When an amorphous Si film is crystallized, its melting point is increased from the original melting point by about 200° C. while its absorption coefficient to the laser beam is reduced. On the other hand, the laser pulses which are irradiated at the second time or later do not crystallize the amorphous Si film, but recrystallize the crystalline Si film which has been already crystallized with the first laser pulse. Thus, the effects of the second or later irradiation are greatly reduced, compared to that of the first one. Therefore, the second and later laser pulses do not contribute to the crystallization as the first laser pulse does.

At the locations a, b, c and d in FIG. 14A, the laser pulse 602 is initially irradiated to crystallize an amorphous Si film so as to form a crystalline Si film. Thereafter, the laser pulses 603 and 604 are subsequently irradiated. At the time of irradiating the Si film with the original laser pulse 602, the energy supplied at each of the locations a, b, c and d is shown by the size of the arrow drawn in the vertical direction from each point. The energy is smallest at the location a, while it is largest at the location d. As a result, the crystallinity at the location a will be poorer than that at the location d. Similarly, the crystalinities at the locations b and c are poorer than that at the location d (that is, non-uniformity of the crystallinity occurs depending upon the locations). The laser pulses 603 and 604 are irradiated in order to repair this non-uniformity, however, as described above, these second and later laser pulses do not contribute to the crystallinity as the first laser pulse (602 in this case) does. Therefore, non-uniformity caused by the first laser pulse 602 is not completely repaired at each of the locations a, b, c and d.

The crystallinity distribution of the crystalline Si film thus obtained in the laser scanning direction 608 has a serrated shape as shown by the symbol 609 in FIG. 14B. That is, a periodical non-uniformity is generated due to the laser scanning pitch P, and each of the locations a, b, c and d provides different crystallinity as shown in FIG. 14B. This non-uniformity of the crystallinity is mainly responsible for the non-uniformity of the characteristics of the crystalline Si film which is successively scanned and crystallized with the laser pulses. This causes the unevenness of the element characteristics, which results in display defects such as uneven display (contrast) in, for example, a liquid crystal display device.

Japanese Laid-open Patent Publication No. 8-201846 focuses on the characteristic unevenness in the driver TFT of a driver monolithic-type active matrix substrate for a liquid crystal display device, and suggests a method of reducing the above-described unevenness. This patent publication describes a relationship between the width of the semiconductor thin film and the overlapping amount (i.e., the pitch) of the laser pulse at the time of the successive scanning, wherein the width of the semiconductor thin film is meant to be a width of a separated Si film forming an active region of the TFT (including both a source/drain region and a channel region). Since the TFT characteristics mainly depend on the film quality (crystallinity) of the channel region, it is difficult to accomplish an adequate uniformity intended for a plurality of the driver TFTs even by using the method as described in the above patent publication.

According to Japanese Laid-open Patent Publication No. 7-92501, semiconductor elements (such as TFTs) are disposed on a straight line, and the straight line is irradiated with a laser light while controlling its position so as to crystallize the active region of the semiconductor element. In other words, the laser light is successively irradiated at the precisely controlled position so that the element regions disposed on each straight line are crystallized by a single irradiation with the laser light. Therefore, each TFT is irradiated with a single laser light so as not to create the overlapping portion at the time of the successive scanning. Each element is crystallized using each laser pulse alone and further using a relatively flat region around the peak top portion in its beam profile without creating an overlapping portion as illustrated in FIGS. 14A and 14B. Accordingly, the number of the laser pulses used for crystallizing all the elements on the substrate corresponds to the number of the element lines arranged on the straight lines.

TFT elements obtained by such a method theoretically provide excellent uniformity, but no device available for this technology has been developed yet. This is because the position control in this technology involves problems such as stage precision, the fluctuation of the laser light itself, and the like, and thus actually causes a great difficulty. Even had such a device been developed, the device itself would be very expensive. Additionally, an excessive time would be required for the position control, and the stage transfer speed would be reduced for increasing the position precision. As a result, the reduction of the productivity would cause increased cost.

Another major problem is in a surface roughness resulting from crystallinity. In the crystallization of a silicon film by the fusion solidification using a laser irradiation, the silicon film is instantly heated to a temperature higher than its melting point (1414° C.) and then cooled to room temperature and solidified over a cooling period of several tens of nanoseconds. At this time, the rapid cooling supercools the silicon film, and solidify it instantly. As a result, the resulting crystal grain size is greatly reduced to approximately 100 to 200 nm, and a portion where the crystal grains collide (i.e., crystal boundary) rises to form bump. This phenomenon is more prominent at a point where three crystal grains collide. This phenomenon becomes greater when the crystallinity is better (i.e., when its crystal grain size is larger).

FIG. 15 is a schematic view depicted based on an interatomic force microscope (AFM) image of the surface condition of a crystalline silicon film which is actually crystallized by the strong light irradiation. The full scale in the X-Y direction in FIG. 15 is 2.0 $\mu$m, and the full scale in the Z direction is 50 nm. When a capacity component is fabricated using a crystalline silicon film as one of the electrodes, the capacity will be higher than the designed value due to its surface roughness. When its crystallinity is varied by the laser scanning as described with reference to FIGS. 14A and 14B, the resulting silicon film has an increased surface roughness which results in a larger variation of the capacity values. The capacity variation of a storage capacitor connected to the pixel TFT in a liquid crystal display device may cause an uneven display such as flicker of the screen.

As described above, a high performance (for example, high-speed, high-resolution), reliable and stable semiconductor device having less variation of crystallinity among each of the semiconductor elements (for example, TFTs), has been demanded.

SUMMARY OF THE INVENTION

The semiconductor device of this invention includes a plurality of thin film transistors on a substrate having an insulating surface. A channel region of said thin film transistor comprises a crystalline Si film crystallized by a successive irradiation with a pulse laser beam in a scanning pitch P, and a size Xs of said channel region in the scanning direction of said pulse laser beam and said scanning pitch P of said pulse laser beam have a relationship approximately equal to Xs=nP where n is an integer of 1 or more.

In one embodiment of the invention, said substrate is an active matrix substrate having the corresponding number of pixel electrodes to that of said thin film transistors, and said thin film transistors are those for switching the pixel connected to said pixel electrodes.

In another embodiment of the invention, said substrate is a driver monolithic-type active matrix substrate having an active matrix portion and a driver circuit, and said thin film transistors constitute a switch for said active matrix portion and said driver circuit.

In still another embodiment of the invention, said size Xs of said channel and said scanning pitch P have a relationship approximately equal to Xs=P.

In still another embodiment of the invention, a ratio Xs/P of said size Xs of said channel region to said scanning pitch P is in the range of 0.9<Xs/P<1.

According to another aspect of the invention, a method for fabricating a semiconductor device is provided. The method includes the steps of: forming a Si film on a substrate having an insulating surface; crystallizing said Si film by successively irradiating said Si film with a pulse laser beam in a scanning pitch P; and patterning said crystallized Si film so as to form a plurality of thin film transistor element regions, wherein the scanning direction of said pulse laser beam is vertical to the channel direction of said thin film transistor, and the channel width $X_W$ of said thin film transistor and the scanning pitch P of said pulse laser beam have a relationship approximately equal to $X_W$=nP where n is an integer of 1 or more.

According to still another aspect of the invention, the method includes the steps of: forming a Si film on a substrate having an insulating surface; crystallizing said Si film by successively irradiating said Si film with a pulse laser beam in a scanning pitch P; and patterning said crystallized Si film so as to form a plurality of thin film transistor element regions, wherein the scanning direction of said pulse laser beam is parallel to the channel direction of said thin film transistor, and the channel length $X_L$ of said thin film transistor and the scanning pitch P of said pulse laser beam have a relationship approximately equal to $X_L$=nP where n is an integer of 1 or more.

According to still another aspect of the invention, the method includes the steps of: forming a Si film on a substrate having an insulating surface; patterning said Si film so as to form a plurality of thin film transistor element regions, wherein the subsequent scanning direction of said pulse laser beam is vertical to the channel direction of said thin film transistor, and the channel width of said thin film transistor is $X_W$; and crystallizing said Si film by successively irradiating said Si film with a pulse laser beam in a scanning pitch P that provides a relationship approximately equal to $X_W$=nP where n is an integer of 1 or more.

According to still another aspect of the invention, the method includes the steps of: forming a Si film on a substrate having an insulating surface; patterning said Si film so as to form a plurality of thin film transistor element regions, wherein the subsequent scanning direction of said pulse laser beam is parallel to the channel direction of said thin film transistor, and the channel length of said thin film transistor is $X_L$; and crystallizing said Si film by successively irradiating said Si film with a pulse laser beam in a scanning pitch P that provides a relationship approximately equal to $X_L$=nP where n is an integer of 1 or more.

In one embodiment of the invention, the method further includes the step of heating said Si film formed on said substrate before the irradiation with said pulse laser beam, so as to crystallize said Si film in a solid phase.

In another embodiment of the invention, the method further includes the step of doping a catalyst element into said Si film before the solid phase crystallization of said Si film.

In still another embodiment of the invention, said solid phase crystallization of said Si film comprises selectively doping a catalyst element into said Si film and heating said Si film so as to grow a crystal from a region in which said catalyst element has been selectively doped to its surrounding portion.

In still another embodiment of the invention, said catalyst element is Ni.

In still another embodiment of the invention, said pulse laser beam has a wavelength of 400 nm or less.

In still another embodiment of the invention, the beam shape of said pulse laser beam is a slender rectangle on the irradiated surface, and said pulse laser beam is successively irradiated in a direction vertical to the longer side of said rectangle beam.

According to still another aspect of the invention, the semiconductor device includes a plurality of thin film transistors on a substrate having an insulating surface. The channel region of said thin film transistor comprises a crystalline Si film crystallized by a successive irradiation with a pulse laser beam in a scanning pitch P, and an arrangement interval Xp of said channel region in the scanning direction of said pulse laser beam and a scanning pitch P of said pulse laser beam have a relationship approximately equal to Xp=nP where n is an integer of 1 or more.

According to still another aspect of the invention, the semiconductor device includes a plurality of thin film transistors driving a pixel electrode and a storage capacitor connected parallel to the pixel capacitor of said thin film transistor on a substrate having an insulating surface. The channel region of said thin film transistor, and one of electrodes of said storage capacitor comprise a crystalline Si film crystallized by a successive irradiation with a pulse laser beam, and an arrangement interval Xp of said channel region in the scanning direction of said pulse laser beam and an arrangement interval of said electrode of said storage capacitor are approximately the same, and said interval Xp and the scanning pitch P of said pulse laser beam have a relationship approximately equal to Xp=nP where n is an integer of 1 or more.

According to still another aspect of the invention, the semiconductor device comprising a plurality of thin film transistors driving pixel electrodes, and a plurality of thin film transistors which constitute a driver circuit driving said thin film transistors driving pixel electrodes. The channel regions of said thin film transistors driving said pixel electrodes and said thin film transistors which constitute said driver circuit comprise a crystalline Si film crystallized by a successive irradiation with a pulse laser beam, and an arrangement interval Xp of said channel region in the scanning direction of said pulse laser beam and the scanning pitch P of said pulse laser beam have a relationship approximately equal to Xp=nP where n is an integer of 1 or more.

In one embodiment of the invention, an arrangement interval Xpg of the channel region of said thin film transistors driving said pixel electrodes and an arrangement interval Xpd of the channel region of said thin film transistors which constitute said driver circuit are different, and said arrangement intervals Xpg and Xpd and a scanning pitch P of said pulse laser beam have relationships approximately equal to Xpg=nP where n is an integer of 1 or more and Xpd=mP where m is an integer of 1 or more.

In another embodiment of the invention, a ratio Xp/P of said arrangement interval Xp of said channel region to said scanning pitch P of said pulse laser beam is in the range of n−0.1.<Xp/P<n+0.1 where n is an integer of 1 or more.

In still another embodiment of the invention, a ratio Xp/P of said arrangement interval Xp of said channel region to said scanning pitch P of said pulse laser beam is in the range of n−0.05<Xp/P<n+0.05 where n is an integer of 1 or more.

In still another embodiment of the invention, said arrangement interval Xp of said channel region and said scanning pitch P of said pulse laser beam have a relationship approximately equal to Xp=P.

According to still another aspect of the invention, a method for fabricating a semiconductor device is provided. The method includes the steps of: forming a Si film on a substrate having an insulating surface; crystallizing said Si film by successively irradiating said Si film with a pulse laser beam in a scanning pitch P; and patterning said crystallized Si film so as to form a plurality of thin film transistor element regions, wherein an arrangement interval Xp of said thin film transistor in the scanning direction of said pulse laser beam and the scanning pitch P of said pulse laser beam have a relationship approximately equal to Xp=nP where n is an integer of 1 or more.

According to still another aspect of the invention, the method includes the steps of: forming a Si film on a substrate having an insulating surface; patterning said Si film so as to form a plurality of thin film transistor element regions, wherein an arrangement interval of the channel region of said thin film transistors in the subsequent scanning direction of a laser beam is Xp; and crystallizing said Si film by successively irradiating said Si film with a pulse laser beam in a scanning pitch P that provides a relationship approximately equal to Xp=nP where n is an integer of 1 or more.

In one embodiment of the invention, the method further includes the step of heating said Si film formed on said substrate before the irradiation with said pulse laser beam, so as to crystallize said Si film in a solid phase.

In another embodiment of the invention, said solid phase crystallization of said Si film comprises selectively doping a catalyst element into said Si film and heating said Si film so as to grow a crystal from a region in which said catalyst element has been selectively doped to its surrounding portion.

In still another embodiment of the invention, said semiconductor device further comprises a storage capacitor connected to said thin film transistors, and one of electrodes of said storage capacitor is formed in the interval Xp simultaneously with patterning said Si film.

In still another embodiment of the invention, a ratio P/Bw of the scanning pitch P of said pulse laser beam to the beam width Bw of said pulse laser beam on the irradiated surface is 0.2 or less.

In still another embodiment of the invention, a ratio P/Bw of the scanning pitch P of said pulse laser beam to the beam width Bw of said pulse laser beam on the irradiated surface is 0.1 or less.

In still another embodiment of the invention, the beam shape of said pulse laser beam is a slender rectangle on the irradiated surface, and said pulse laser beam is successively irradiated in a direction vertical to the longer side of said rectangle beam.

Thus, the invention described herein makes possible the advantages of: (1) providing a high performance (for example, high-speed, high-resolution), reliable and stable semiconductor device having less variation of crystallinity among each of the semiconductor elements (for example, TFTs); (2) providing a semiconductor device which provides a larger scale, high-resolution active matrix liquid crystal display apparatus, and a driver monolithic-type active matrix liquid crystal display apparatus; (3) providing a semiconductor device which provides a liquid crystal display device having a high quality display without any stripe-shaped defects due to the laser beam scanning; and (4) providing a simple, less expensive method for fabricating such semiconductor devices.

These and other advantages of the present invention will become apparent to those skilled in the art upon reading and understanding the following detailed description with reference to the accompanying figures.

BRIEF DESCRIPTION OF THE DRAWINGS

FIG. 3 is a schematic plan view of a semiconductor device comprising a plurality of CMOS circuits formed on a substrate according to another preferred embodiment of the present invention.

FIG. 6 is a schematic plan view of an active matrix substrate according to still another preferred embodiment of the present invention.

FIG. 8 is a schematic plan view of an active matrix substrate comprising a storage capacitor according to still another preferred embodiment of the present invention.

FIG. 15 is a schematic view depicted based on an interatomic force microscope (AFM) image of the surface condition of a crystalline silicon film which is actually crystallized by the strong light irradiation.

DESCRIPTION OF THE PREFERRED EMBODIMENTS

In the present specification, the term "a size of the channel region of a TFT in the scanning direction of a laser pulse" is meant to include a length of the channel region of the TFT in the scanning direction of a laser pulse. For example, when the scanning direction of a laser pulse is parallel to the channel direction of a TFT, a size of the channel region is a length of the channel (a length of the TFT in the channel direction), and when the scanning direction of a laser pulse is vertical to the channel direction of a TFT, a size of the channel region is a width of the channel (a length of the TFT in the direction vertical to the channel direction).

The term "an arrangement interval of the channel region of a TFT in the scanning direction of a laser pulse" is meant to include an interval between the TFTs placed on the lines adjacent to each other in the scanning direction of a laser pulse.

The following embodiments specifically illustrate the present invention with reference to the drawings, but the present invention is not limited to these embodiments. Embodiments 1 and 2 illustrate a case where a relationship between a size of the channel region of a TFT and a scanning pitch of a laser pulse is defined, and Embodiments 3–5 illustrate a case where a relationship between an arrangement interval of the channel region of a TFT and a scanning pitch of a laser pulse is defined.

Embodiment 1

Figure 1:
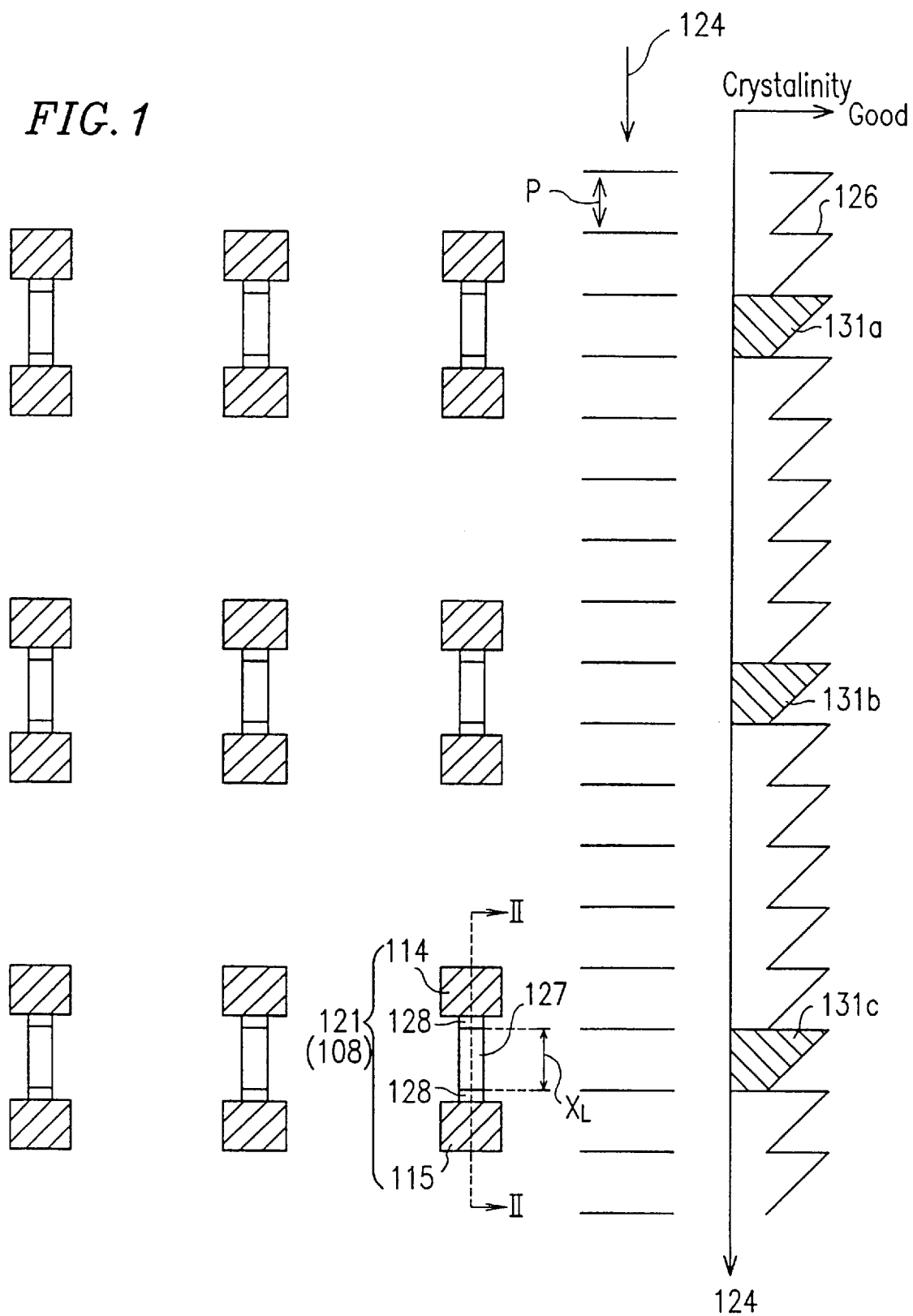
FIG. 1 is a schematic plan view of an active matrix substrate according to a preferred embodiment of the present invention.

A preferred embodiment of the present invention is illustrated with reference to FIG. 1 and FIGS. 2A to 2E. The present embodiment is a case where the present invention is applied to an active matrix substrate for a liquid crystal display device. FIG. 1 is a schematic plan view of this active matrix substrate. FIGS. 2A to 2E are schematic views for illustrating a method for fabricating the active matrix substrate of FIG. 1, which are sectional views taken along the line II—II of FIG. 1.

As shown in FIG. 1, N-type TFTs 121 are formed in a matrix shape as an element for switching each pixel on the active matrix substrate (several hundred thousand TFTs 121 are arranged on an actual active matrix substrate).

Figure 2A:
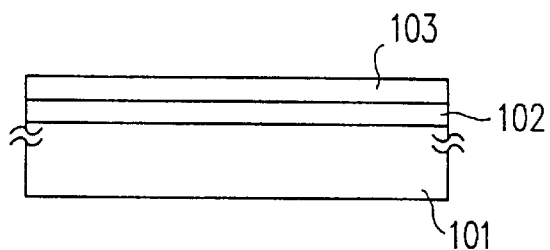
FIGS. 2A to 2E are schematic views for illustrating a method for fabricating the active matrix substrate of FIG. 1, which are sectional views taken along the line II—II of FIG. 1.

The structure of the active matrix substrate is illustrated together with a method for fabricating it with reference to FIGS. 2A to 2E. First, as shown in FIG. 2A, a base film 102 comprising $SiO_2$ and having a thickness of approximately 300 nm is formed on a glass substrate 101 by, for example, a sputtering method. The $SiO_2$ film 102 is provided so as to prevent the impurities contained in the glass substrate 101 from diffusing.

Then, an amorphous Si (a-Si) film 103 having a thickness of about 20 to 100 nm, for example, about 30 nm is formed on the $SiO_2$ film 102 by a reduced pressure CVD method, a plasma CVD method, or the like. Since the a-Si film 103 obtained by a plasma CVD method contains a large amount of hydrogen, the film may be peeled off at the time of the subsequent laser pulse irradiation. Therefore, it is preferred that the film be subjected to a thermal treatment at approximately 450° C. for several hours to remove the hydrogen contained in the film.

Figure 2B:
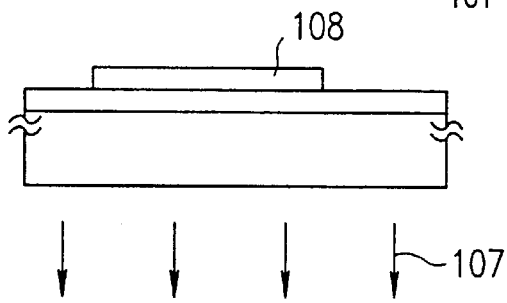

Then, as shown in FIG. 2B, an undesired portion of the a-Si film 103 is removed by any suitable method so as to form an island-like Si film 108 constituting an active region of a TFT (a source/drain region and a channel region). When the glass substrate 101 is viewed from the top, the active region 108 of each TFT 121 is disposed as shown in FIG. 1, wherein the symbol 114 of FIG. 1 represents a source region of the resulting TFT 121, 115 represents a drain region, 127 represents a channel region, and 128 represents an offset region. A carrier moves from the source region 114 to the drain region 115 at the time of driving the TFT 121. In other words, the channel direction, which is a carrier moving direction, is a direction from the top to the bottom of the paper in FIG. 1.

Figure 2C:
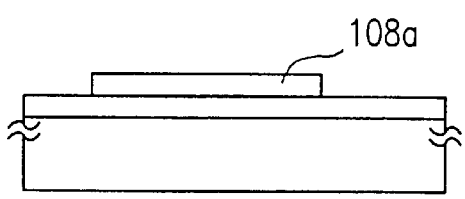

Thereafter, as shown in FIG. 2C, the island-like a-Si film 108 is irradiated with a laser pulse 107 to be crystallized. The laser beams that can be used include XeCl excimer laser (having a wavelength of 308 nm and a pulse width of 40 nsec). The laser pulse 107 is irradiated at an energy density of about 200 to 350 $mJ/cm^2$, for example about 300 $mJ/cm^2$, while heating the glass substrate 101 to about 200 to 500° C., for example about 400° C. at the time of the irradiation.

The laser pulse 107 is shaped with a homogenizer so that the beam on the substrate surface has a slender rectangle shape (e.g., 300 mm×0.2 mm), and is successively scanned in the direction vertical to its longer side. In the present embodiment, the scanning direction of the laser pulse 107 with respect to the TFT 121 is shown by the arrow 124 in FIG. 1. That is, the scanning direction 124 of the laser pulse 107 is parallel to (in the same direction as) the channel direction of the TFT 121. In the present embodiment, the overlapping amount of the laser pulse 107 in the successive scanning is set to be 95%. Therefore, the scanning pitch P in FIG. 1 is 10 $\mu$m, and any one point of the a-Si film 108 is subjected to the laser irradiation twenty times each.

According to this step, the a-Si film 108 is heated to a temperature higher than its melting point, and fused and solidified to form a crystalline Si film 108a having good crystallinity. The crystallinity distribution of the crystalline Si film 108a has a serrated shape as shown by the symbol 126 of FIG. 1, wherein the horizontal axis indicates the crystallinity and a further right-hand direction provides better crystallinity. The mechanism that the crystallinity distribution has a serrated shape is as illustrated above with reference to FIG. 14B, and therefore is not mentioned here.

Figure 2D:
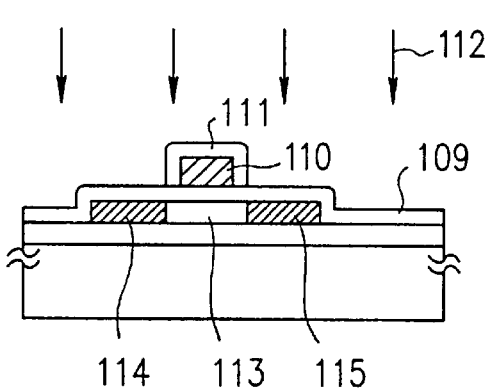

Then, as shown in FIG. 2D, a $SiO_2$ film having a thickness of about 20 to 150 nm, about 100 nm in this embodiment is formed as a gate insulating film 109 so that it covers the above-described crystalline Si film 108a which constitutes an active region. In the present embodiment, the $SiO_2$ film is formed by using TEOS (tetraethoxy orthosilicate) as a starting material, and decomposing and depositing it together with oxygen at a substrate temperature of about 150 to 600° C., preferably about 300 to 450° C., by an RF plasma CVD method. Alternatively, it is possible to form the $SiO_2$ film by using TEOS as a starting material together with ozone gas at a substrate temperature of about 350 to 600° C., preferably about 400 to 550° C., by a reduced pressure CVD method or an ordinary pressure CVD method.

Subsequently, an Al film having a thickness of about 300 to 600 nm, for example about 400 nm is formed by a sputtering method. Then, the Al film is patterned by any suitable method to form a gate electrode 110. Furthermore, the surface of the gate electrode 110 is anodically oxidized to form an anodically oxidized layer 111 on the surface thereof (See, FIG. 2D).

The anodic oxidation is conducted by, for example, initially increasing the voltage to 220 V at a constant current in an ethylene glycol solution containing about 1 to 5% tartaric acid, and then maintaining this condition for 1 hour. In the present embodiment, the resulting anodically oxidized layer 111 has a thickness of about 200 nm. An offset gate region is formed from the anodically oxidized layer 111 in the subsequent ion doping step. Therefore, the offset gate region having the prescribed length is obtained by forming the anodically oxidized layer having the prescribed thickness. The offset gate region is provided for the purpose of reducing the leak current when the TFT is not operated. Moreover, the channel length $X_L$ of the TFT 121 is determined by the gate width of the resulting gate electrode 110.

In the present embodiment, the gate and a drain region of the TFT, respectively. On the other hand, the region 113 which is masked by the gate electrode 110 and the anodically oxidized layer 111 and into which no impurity is doped constitutes a channel region 127 and an offset gate region 128 of the TFT 121.

Thereafter, as shown in FIG. 2D, they are annealed by the irradiation with the laser beam 112 to activate the impurity which has been tonically doped, and at the same time to improve the crystallinity of a portion having deteriorated crystallinity due to the above-described impurity doping. In the present embodiment, an XeCl excimer laser (having a wavelength of 308 nm and a pulse width of 40 nsec) irradiates at an energy density of about 150 to 400 mJ/cm², preferably about 200 to 250 mJ/cm². The sheet resistance of the N-type impurity (phosphorus) regions 114 and 115 which is actually measured is 200 to 800 Ω/□.

Figure 2E:
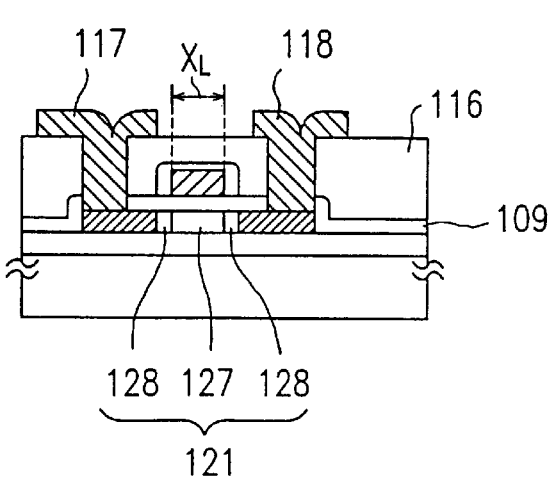

Moreover, as shown in FIG. 2E, a $SiO_2$ film having a thickness of approximately 600 nm is formed as an interlayer insulating film 116. The $SiO_2$ film is formed using TEOS as a starting material by a plasma CVD method together with oxygen, or by a reduced pressure CVD electrode is patterned so that the resulting gate width is 10 μm. That is, both the channel length $X_L$ of the channel region 127 of the TFT 121 as shown in FIG. 1 and the scanning pitch P of the laser pulse are set to be 10 μm. The crystallinity distribution of the channel region 127 of the TFT 121 is represented by the shape 131a, 131b and 131c for each TFT present in different lines, all of which have the same shape (i.e., the same crystallinity distribution). Therefore, each TFT has the same crystallinity distribution. In other words, since all the crystallinity distributions resulted from the scanning of the laser pulse are similarly included in the channel region 127 of the TFT 121, there is no unevenness in the crystallinity among the TFTs 121.

Then, an impurity (e.g., phosphorus) is doped into the active region by an ion doping method using the gate electrode 110 and its surrounding anodically oxidized layer 111 as a mask. Phosphine ($PH_3$) is used as the doping gas, and the accelerating voltage is about 60 to 90 kV, for example about 80 kV, and the doping amount is about $1 \times 10^{15}$ to $8 \times 10^{15}$ cm$^{-2}$, for example about $2 \times 10^{15}$ cm$^{-2}$. Thus, the regions 114 and 115 into which the impurity is doped constitute a source region method or an ordinary pressure CVD method together with ozone. The interlayer insulating film formed in the above-mentioned manner has excellent coating property with respect to an uneven surface.

Then, contact holes are formed in the interlayer insulating film 116 by any suitable method, and a source electrode 117 and a drain electrode 118 are formed by any suitable method. The source electrode 117 is formed by using, for example, a metal material (e.g., a two-layer film of TiN (titanium nitride) and Al). In this case, the TiN film is provided as a barrier film for the purpose of preventing Al from diffusing into the semiconductor layer. Moreover, a pixel electrode is formed using a transparent conductive film such as ITO film.

Finally, they are annealed, for example, at 350° C. under one atmospheric pressure of hydrogen for approximately one hour to complete an N-type TFT 121 as shown in FIG. 2E. The annealing treatment provides hydrogen atoms at the interface between the active region of the TFT 121 and the gate insulating film so as to reduce unpaired bonding which deteriorates the TFT characteristics. In order to protect the TFT 121, the TiN film may optionally be formed by a plasma CVD method using $SiH_4$ and $NH_3$ as starting gases to cover the prescribed portion of the TFT.

Each TFT 121 which is actually fabricated according to the above-described steps provides excellent characteristics having a field-effect mobility of 60 to 80 cm²/Vs, and a threshold voltage of 1.5 to 2 V in all the panels fabricated. Moreover, the TFTs 121 in the panel have excellent uniformity and a field-effect mobility difference of approximately ±8%, and a threshold voltage difference of approximately ±0.2 V. When a liquid crystal display device is fabricated using the active matrix substrate of the present embodiment and the overall display is performed, the uneven display due to the non-uniformity of the TFT characteristics is largely reduced and a liquid crystal display device having higher display quality is obtained.

Embodiment 2

Another preferred embodiment of the present invention is illustrated with reference to FIG. 3, FIG. 4 and FIGS. 5A to 5F. The present embodiment is a case where the present invention is applied to a semiconductor device comprising a plurality of CMOS circuits (circuit elements) formed on a substrate. The CMOS circuit (circuit element) is composed complementarily of an N-type TFT and a P-type TFT and constitutes a basis for a thin film integrated circuit.

Figure 4:
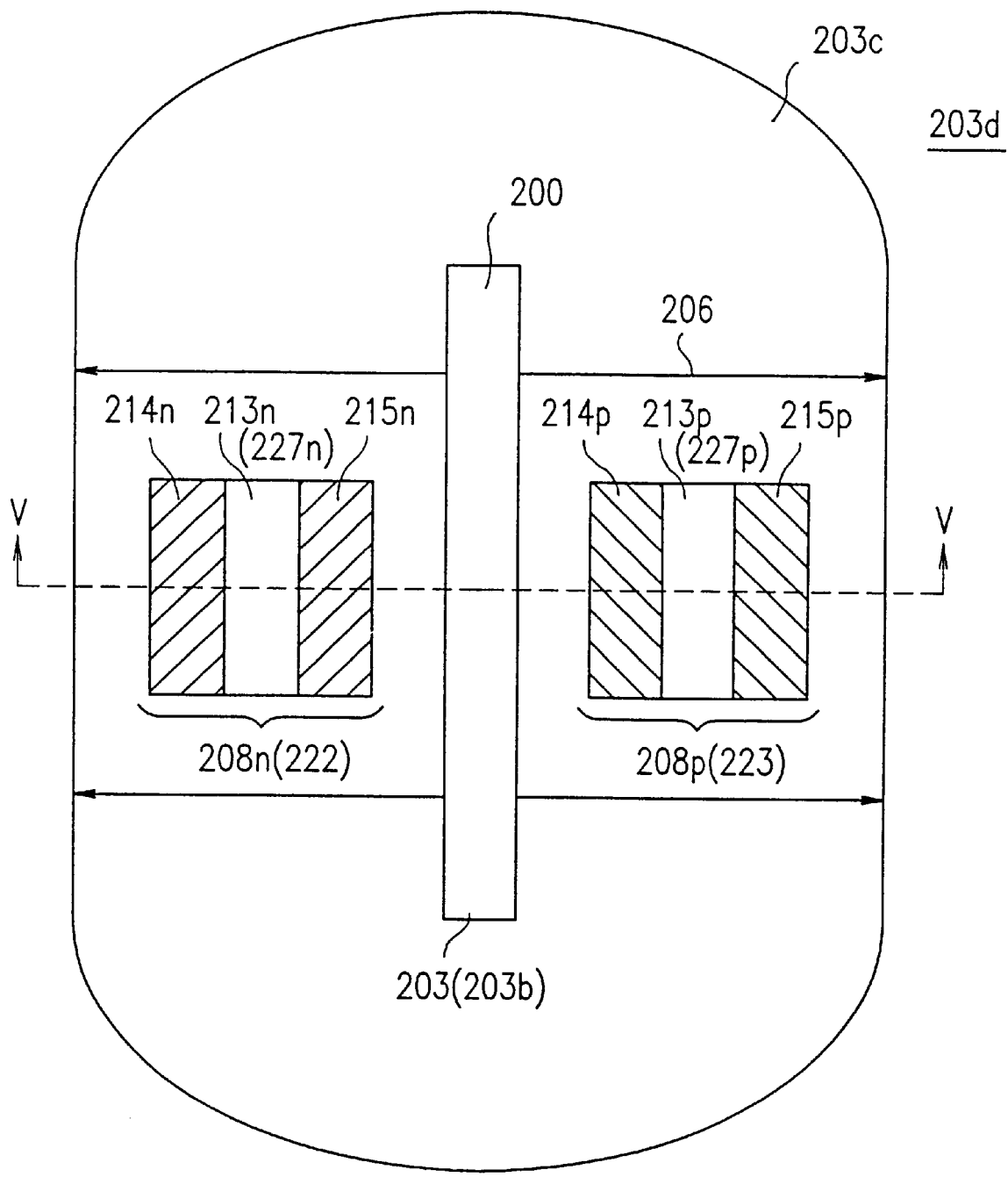
FIG. 4 is a schematic plan view for illustrating a method for fabricating the semiconductor device of FIG. 3.

FIG. 3 is a schematic plan view of the semiconductor device, FIG. 4 is a schematic plan view for illustrating a method for fabricating the semiconductor device of FIG. 3, and FIGS. 5A to 5F are schematic sectional views for illustrating a method for fabricating the semiconductor device.

Figure 5A:
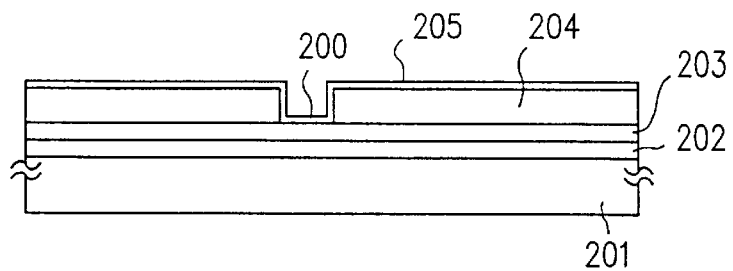
FIGS. 5A to 5F are schematic sectional views for illustrating a method for fabricating the semiconductor device of FIGS. 3 and 4, which are sectional views taken along the line V—V of FIG. 4.
Figure 5B:
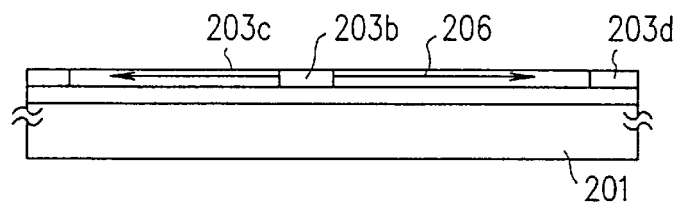
Figure 5C:
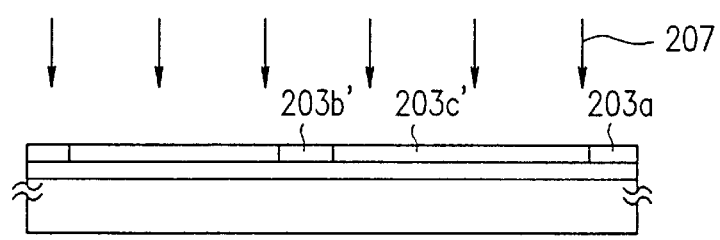
Figure 5D:
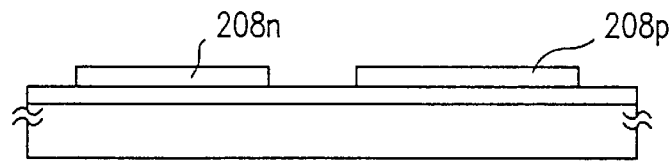
Figure 5E:
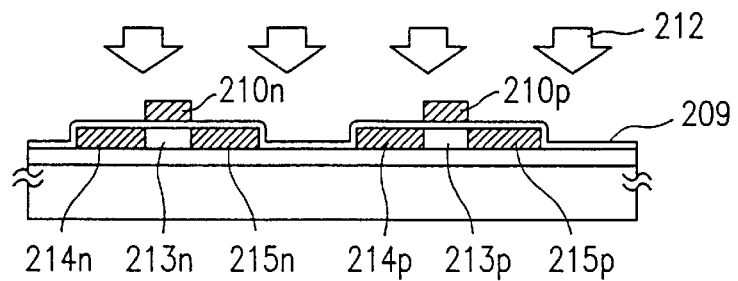
Figure 5F:
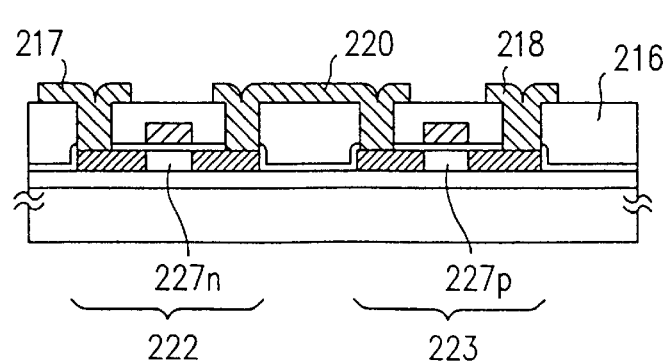

As shown in FIG. 3, the CMOS circuit comprises a plurality of N-type TFTs 222 and P-type TFTs 223 formed on a substrate, and FIG. 5F shows its finished sectional structure. The following illustrates the structure of the semiconductor device together with a method for fabricating the device.

First, as shown in FIG. 5A, a base film 202 comprising $SiO_2$ and having a thickness of approximately 300 nm is formed on a glass substrate 201 by, for example, a sputtering method. The base film 202 is provided so as to prevent the impurities contained in the glass substrate 201 from diffusing. Then, an intrinsic (I-type) amorphous Si (a-Si) film 203 having a thickness of about 20 to 100 nm, for example about 50 nm, is formed by a reduced pressure CVD method, a plasma CVD method, or the like.

Then, a photosensitive resin (e.g., photoresist) is applied onto the a-Si film 203, exposed to light, and developed so as to form a photoresist mask 204. The a-Si film 203 is exposed in a slit shape in the region 200 by the throughhole of the photoresist mask 204 as shown in FIG. 4. When the substrate of FIG. 5A is viewed from the top, the a-Si film 203 is exposed in the region 200 as shown in FIG. 4, and the other portions are masked by the photoresist.

Then, as shown in FIG. 5A, Ni is deposited on a glass substrate 201 on which the base film 202, the a-Si film 203 and the mask 204 are formed, so as to form a thin film 205. In the present embodiment, the thickness of the Ni thin film 205 is adjusted to approximately 1 nm or less by making the distance between the deposition source and the glass substrate 201 greater than usual to reduce the deposition rate. The surface density of the Ni thin film 205 which is actually measured is approximately $1 \times 10^{13}$ atom s /cm$^2$.

Subsequently, the photoresist mask 204 is removed by any suitable method, which lifts of f the Ni thin film 205 on the photoresist mask 204. As a result, a slight amount of Ni is selectively added to the a-Si film 203 in the region 200. Then, the a-Si film is crystallized by annealing, for example, at a temperature of 550° C. for 8 hours under an inert atmosphere.

As shown in FIG. 5B, this crystallization of the a-Si film 203 proceeds in the direction vertical to the glass substrate 201 using as a nucleus Ni which is added to the surface of the a-Si film 203 in the region 200, so as to form a crystalline Si-film 203b (see also FIG. 4). Then, the crystal is grown in the horizontal direction (the direction parallel to the glass substrate 201) from the region 200 to a region surrounding the region 200 as indicated by the arrow 206 in FIGS. 4 and 5B, so as to form a horizontally grown crystalline Si film 203c. The other regions in the a-Si film 203 remain as an amorphous Si region 203d. The size of the grown crystal in the direction parallel to the glass substrate 201 which is actually measured is approximately 40 μm.

Thereafter, as shown in FIG. 5C, the Si film 203 is irradiated with a laser pulse 207 to be recrystallized. The laser beams that can be used include XeCl excimer laser (having a wavelength of 308 nm and a pulse width of 40 nsec). The laser pulse 207 irradiates at an energy density of about 200 to 350 mJ/cm$^2$, for example about 320 mJ/cm$^2$, while heating the glass substrate 201 to about 200 to 500° C., for example about 400° C. at the time of the irradiation. The laser pulse 207 is shaped with a homogenizer so that the beam on the substrate surface has a slender rectangle shape (e.g., 150 mm×1 mm), and is successively scanned in the direction vertical to its longer side. The laser scanning direction with respect to the final TFT element arrangement have a relationship as illustrated in FIG. 3, and its scanning direction is indicated by the symbol 224. In the present embodiment, the overlapping amount of the beam in the successive scanning is set to be 90%. Therefore, the scanning pitch P in FIG. 3 is 100 μm, and any one point of the a-Si film 203 is subjected to the laser irradiation ten times each.

According to this step, the crystalline Si film regions 203b and 203c are heated to a temperature higher than their melting points, and fused and solidified to be recrystallized using a portion thereof as a seed crystal and to form Si film regions 203b' and 203c' having better crystallinity. The a-Si film region 203d is crystallized to form a crystalline Si-film 203a. The crystallinity distribution of the crystalline Si film 203a has a serrated shape as shown by the symbol 226 of FIG. 3, wherein the horizontal axis indicates the crystallinity and a further right-hand direction provides better crystallinity.

Thereafter, the prescribed portion of crystalline Si film is removed by etching so as to be separated so that a high quality crystalline Si film region 203c' constitutes active regions (element regions) 208n and 208p of the TFT, as shown in FIGS. 4 and 5D. When the glass substrate 201 is viewed from the top, an active region 208 (208n, 208p) for each of the TFTs 222 and 223 is disposed as shown in FIG. 4, respectively. In FIG. 3, the regions 214 (214n, 214p)/215 (215n, 215p) constitute a source/drain region. The region 213 (227), specifically 213n, 213p (227n, 227p) constitutes a channel region.

As can be seen from FIG. 3, the scanning direction 224 of the laser pulse is designed to be vertical to the channel direction of the TFT (i.e., the moving direction of the carrier, corresponding to the direction from the left to the right in the paper) in the present embodiment. Therefore, the channel size of the TFT 222 in the laser scanning direction 224 is a channel width X$_W$, and the active region 208 is formed so that the channel width X$_W$ is the same as the laser scanning pitch P (100 μm). The crystallinity distribution of the channel region 227 of the TFT 121 is represented by the shape 231a, 231b and 231c for each TFT in different lines, all of which have the same area (i.e., having the same crystallinity). Therefore, although each TFT in different lines has a different crystallinity distribution, each TFT has the same crystallinity. In other words, since all the crystallinity distributions resulting from the scanning of the laser pulse are included in the channel region 227 of each TFT in the same amount, there is no unevenness in the crystallinity among the TFTs.

Then, as shown in FIG. 5E, a SiO$_2$ film having a thickness of about 100 nm is formed as a gate insulating film 209 so as to cover the crystalline Si films 208n and 208p which constitute an active region. In the present embodiment, the gate insulating film 209 is formed by using TEOS as a starting material, and decomposing and depositing it together with oxygen at a substrate temperature of about 300 to 400° C. by an RF plasma CVD method. Preferably, after forming the film, the gate insulating film 209 is annealed at about 400 to 600° C. for several hours under an inert gas atmosphere in order to improve a bulk property of the gate insulating film 209 as well as the interface property between the crystalline Si film and the gate insulating film 209.

Subsequently, an Al (containing 0.1 to 2% of silicon) film having a thickness of about 400 to 800 nm, for example about 500 nm, is formed by a sputtering method, as shown in FIG. 5E. Then, the Al film is patterned by any suitable method to form gate electrodes 210n and 210p.

Then, impurities (e.g., phosphorus (P) and boron (B)) are doped into the active regions 208n and 208p by an ion doping method using the gate electrodes 210n and 210p as a mask. Phosphine (PH$_3$) and diborane (B$_2$H$_6$) are used as the doping gas. The accelerating voltage is about 60 to 90 kV, for example about 80 kV for P, and is about 40 to 80 kV, for example about 65 kV for B. The doping amount is about $1 \times 10^{15}$ to $8 \times 10^{15}$ cm$^{-2}$, for example about $2 \times 10^{15}$ cm$^{-2}$ for P and is about $5 \times 10^{15}$ cm$^{-2}$ for B. According to this step, the regions 213n and 213p which are masked by the gate electrodes 210n and 210p and into which no impurity is doped constitute TFT channel regions 227n and 227p. In the doping operation, each impurity is selectively doped by covering the undesired region with a photoresist.

As a result, N-type impurity regions 214n and 215n, and P-type impurity regions 214p and 215p are formed, which can result in the formation of an N-channel type TFT 222 and a P-channel type TFT 223, as shown in FIGS. 5E and 5F. When the substrate is viewed from the top, as shown in FIG. 4, the crystal growth direction 206 in the active regions 208n and 208p is parallel to the carrier moving direction (i.e., from the source to the drain direction). This arrangement provides a TFT having higher mobility.

Thereafter, as shown in FIG. 5E, they are annealed by the irradiation with a laser beam 212 to activate the impurities which have been tonically doped. In the present embodiment, XeCl excimer laser (having a wavelength of 308 nm and a pulse width of 40 nsec) is used, and one location is irradiated with four shots of the laser beam at an energy density of about 250 mJ/cm$^2$.

Subsequently, as shown in FIG. 5F, a SiO$_2$ film having a thickness of about 600 nm is formed by a plasma CVD method using TEOS as a starting material to form an interlayer insulating film 216. Then, contact holes are formed in the interlayer insulating film, and TFT electrodes and lines 217, 218 and 220 are formed using a metal material (such as a two-layer film of TiN and Al). Finally, they are annealed, for example, at about 350° C. for approximately one hour under one atmosphere of hydrogen to complete an N-type TFT 222 and a P-type TFT 223 which constitute a CMOS circuit.

Each of the TFT 222 and 223 in the CMOS circuit thus fabricated according to the above-described steps provides excellent characteristics as having a field-effect mobility of 150 to 180 cm$^2$/Vs for the N-type TFT 222 and 80 to 100 cm$^2$/Vs for the P-type TFT 223, and a threshold voltage of 0.5 to 1 V for the N-type TFT 222 and −2.5 to −3V for the P-type TFT 223. The TFTs 222 and 223 in a panel provide excellent uniformity as having a field-effect mobility difference of approximately ±10%, and a threshold voltage difference of ±0.2 V or less.

Embodiment 3

Still another preferred embodiment of the present invention is illustrated with reference to FIGS. 6 and FIGS. 7A to 7E. The present embodiment is a case where the present invention is applied to an active matrix substrate for a liquid crystal display device. FIG. 6 is a schematic plan view of the active matrix substrate. FIGS. 7A to 7E are schematic sectional views for illustrating a method for fabricating the active matrix substrate of FIG. 6.

As shown in FIG. 6, the active matrix substrate comprises an N-type TFT 321 formed in a matrix shape as an element for switching each pixel electrode. FIG. 7E is a schematic sectional view of the finished active matrix substrate.

Figure 7A:
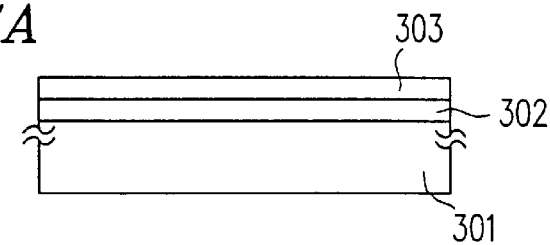
FIGS. 7A to 7E are schematic sectional views for illustrating a method for fabricating the active matrix substrate of FIG. 6.
Figure 7B:
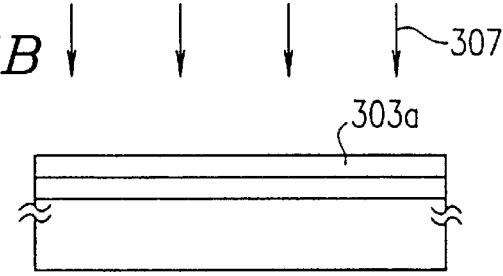
Figure 7C:
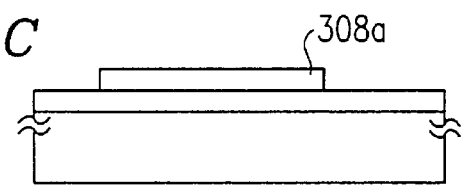
Figure 7D:
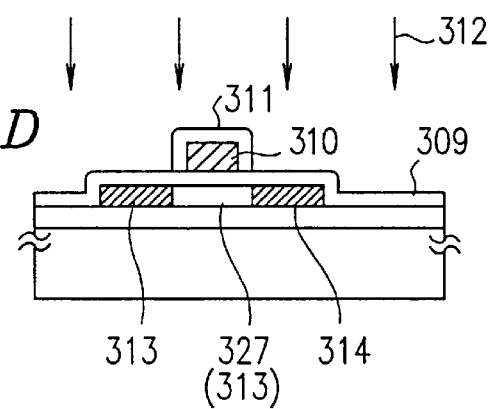
Figure 7E:
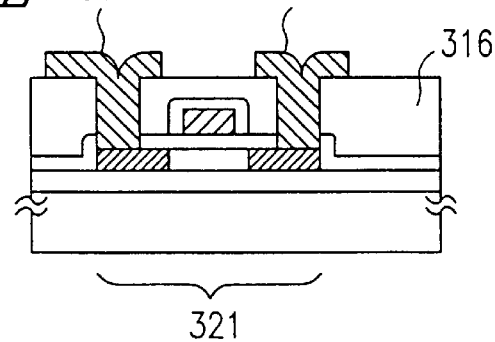

The structure of the active matrix substrate is illustrated together with a method for fabricating it with reference to FIGS. 7A to 7E. First, as shown in FIG. 7A, a base film 302 comprising SiO$_2$ and having a thickness of approximately 300 nm is formed on a glass substrate 301 by, for example, a sputtering method. The SiO$_2$ film 302 is provided so as to prevent the impurities contained in the glass substrate 301 from diffusing.

Then, an amorphous Si (a-Si) film 303 having a thickness of about 20 to 100 nm, for example about 30 nm, is formed on the SiO$_2$ film 302 by a reduced pressure CVD method, a plasma CVD method, or the like. Since the a-Si film 303 obtained by a plasma CVD method contains a large amount of hydrogen, the film may be peeled off at the time of the subsequent laser pulse irradiation. Therefore, it is preferred that the film be subjected to a thermal treatment at approximately 450° C. for several hours to remove the hydrogen contained in the film.

Thereafter, as shown in FIG. 7B, the a-Si film 303 is irradiated with a laser pulse 307 to be crystallized. The laser beams that can be used include XeCl excimer laser (having a wavelength of 308 nm and a pulse width of 40 nsec). The laser pulse 307 irradiates at an energy density of about 200 to 350 mJ/cm$^2$, for example about 300 mJ/cm$^2$, while heating the glass substrate to about 200 to 500° C., for example about 400° C., at the time of the irradiation. The laser pulse 307 is shaped with a homogenizer so that the beam on the substrate surface has a slender rectangle shape (e.g., 150 mm×1 mm), and is successively scanned in the direction vertical to its longer side, i.e., the laser scanning direction 324 in FIG. 6. In the present embodiment, the overlapping amount of the laser pulse 307 in the successive scanning is set to be 95%. Therefore, the scanning pitch P in FIG. 6 is 50 μm, and any one point of the a-Si film 303 is subjected to the laser irradiation twenty times each. According to this step, the a-Si film 303 is heated to a temperature higher than its melting point, and fused and solidified to form a crystalline Si film 303a having good crystallinity.

Then, as shown in FIG. 7C, an undesired portion of the a-Si film 303a is removed by any suitable method so as to form an island-like Si film 308a constituting an active region (a source region, a drain region and a channel region) of TFT. When the substrate 301 is viewed from the top, the island-like crystalline Si film 308a which constitutes an active region of each TFT is disposed as shown in FIG. 6. The arrangement interval X$_p$ of the island-like crystalline Si film 308a in the laser scanning direction 324 is designed to be 100 μm. Thus, the arrangement interval X$_p$ of the TFT is twice as much as the laser scanning pitch P.

Additionally, in FIG. 6, the symbols 313, 314 and 315 denote the channel region, the source region and the drain region of the pixel TFT 321, respectively.

Then, as shown in FIG. 7D, a SiO$_2$ film having a thickness of about 20 to 150 nm (about 100 nm in the present embodiment) is formed as a gate insulating film 309 so as to cover the island-like crystalline Si film 308a which constitutes an active region. In the present embodiment, the SiO$_2$ film is formed by using TEOS (tetraethoxy orthosilicate) as a starting material, and depositing and accumulating it together with oxygen at a substrate temperature of about 150 to 600° C., preferably about 300 to 450° C. by an RF plasma CVD method. Alternatively, it is possible to form the SiO$_2$ film by using TEOS as a starting material together with ozone gas at a substrate temperature of about 350 to 600° C., preferably about 400 to 550° C., by a reduced pressure CVD method or an ordinary pressure CVD method.

Subsequently, an Al film having a thickness of about 300 to 600 nm, for example about 400 nm is formed by a sputtering method. Then, the Al film is patterned by any suitable method to form a gate electrode 310. Furthermore, the surface of the gate electrode 310 is anodically oxidized to form an anodically oxidized layer 311 on the surface thereof (See, FIG. 7D).

The anodic oxidation is conducted by, for example, initially increasing the voltage to 220 V at a constant current in an ethylene glycol solution containing about 1 to 5% tartaric acid, and then maintaining this condition for 1 hour. In the present embodiment, the resulting anodically oxidized layer 311 has a thickness of about 200 nm. An offset gate region (not shown) is formed from the anodically oxidized layer 311 in the subsequent ion doping step. Therefore, the offset gate region having the prescribed length is obtained by forming the anodically oxidized layer having the prescribed thickness.

Then, an impurity (e.g., phosphorus) is doped into the active region by an ion doping method using the gate electrode 310 and its surrounding anodically oxidized layer 311 as a mask. Phosphine ($PH_3$) is used as the doping gas, and the accelerating voltage is about 60 to 90 kV, for example about 80 kV, and the doping amount is about $1\times10^{15}$ to $8\times10^{15}$ $cm^{-2}$, for example about $2\times10^{15}$ $cm^{-2}$. Thus, the regions 314 and 315 into which the impurity is doped constitute a source region and a drain region of the TFT, respectively. On the other hand, the region 313 which is masked by the gate electrode 310 and its surrounding anodically oxidized layer 311 and into which no impurity is doped constitutes a channel region 327 of the TFT 321.

Thereafter, as shown in FIG. 7D, they are annealed by irradiation with the laser beam 312 to activate the impurity which has been ionically doped, and at the same time to improve the crystallinity of a portion having deteriorated crystallinity due to the above-described impurity doping. In the present embodiment, XeCl excimer laser (having a wavelength of 308 nm and a pulse width of 40 nsec) is irradiated at an energy density of about 150 to 400 $mJ/cm^2$, preferably about 200 to 250 $mJ/cm^2$. The sheet resistance of the N-type impurity (phosphorus) regions 314 and 315 which is actually measured is 200 to 800 $\Omega/\square$.

Moreover, as shown in FIG. 7E, a $SiO_2$ film having a thickness of approximately 600 nm is formed as an interlayer insulating film 316. The $SiO_2$ film is formed using TEOS as a starting material by a plasma CVD method together with oxygen, or by a reduced pressure CVD method or an ordinary pressure CVD method together with ozone. The interlayer insulating film formed in the above-described manner has excellent coating property with respect to an uneven surface.

Then, contact holes are formed in the interlayer insulating film 316 by any suitable method, and a source electrode 317 and a drain electrode 318 are formed by any suitable method. The source electrode 317 is formed by using, for example, a metal material (such as a two-layer film of TiN and Al). In this case, the TiN film is provided as a barrier film for the purpose of preventing Al from diffusing into the semiconductor layer. Moreover, a pixel electrode is formed using a transparent conductive film such as ITO film.

Finally, they are annealed, for example, at 350° C. under one atmospheric pressure of hydrogen for approximately one hour to complete an N-type TFT 321 shown in FIG. 7E. The annealing treatment provides hydrogen atom at the interface between the active region of the TFT 321 and the gate insulating film so as to reduce unpaired bonding which deteriorates the TFT characteristics. In order to protect the TFT 321, the TiN film may optionally be formed by a plasma CVD method using $SiH_4$ and $NH_3$ as starting gases to cover the prescribed portion of the TFT.

Each TFT 321 which is actually fabricated according to the above-described steps provides excellent characteristics having a field-effect mobility of 40 to 80 $cm^2/Vs$, and a threshold voltage of 1.5 to 3 V in all the fabricated panels. Moreover, the TFTs 321 in the panel have excellent uniformity and a field-effect mobility difference of approximately ±8%, and a threshold voltage difference of approximately ±0.2 V, although there is some variation in the TFT characteristics among different panels within the above-described ranges. When a liquid crystal display device is fabricated using the active matrix substrate of the present embodiment and the overall display is performed, the uneven display due to the non-uniformity in the TFT characteristics is largely reduced and a liquid crystal display device having higher display quality is obtained.

Embodiment 4

Still another preferred embodiment of the present invention is illustrated with reference to FIG. 8 and FIGS. 9A to 9E. The present embodiment is also a case where the present invention is applied to an active matrix substrate for a liquid crystal display device. This active matrix substrate further comprises a storage capacitor Cs parallel to the pixel liquid crystal capacitor in the drain region side of the TFT. FIG. 8 is a schematic plan view of the active matrix substrate. FIGS. 9A to 9E are schematic views for illustrating a method for fabricating the active matrix substrate of FIG. 8.

As shown in FIG. 8, the active matrix substrate comprises an N-type TFT 421 formed in a matrix shape as an element for switching each pixel electrode, and a storage capacitor 434 in the drain side of the TFT. FIG. 9E is a schematic sectional view of the finished active matrix substrate.

Figure 9A:
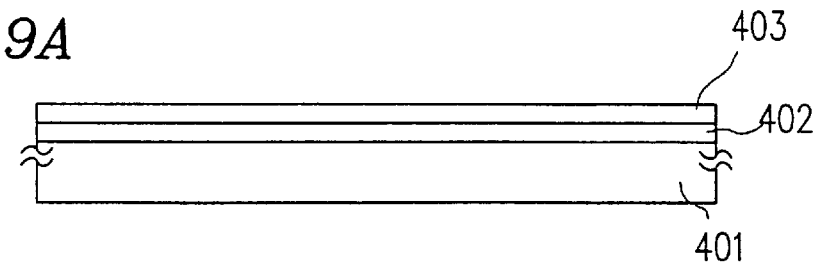
FIGS. 9A to 9E are schematic sectional views for illustrating a method for fabricating the active matrix substrate of FIG. 8.
Figure 9B:
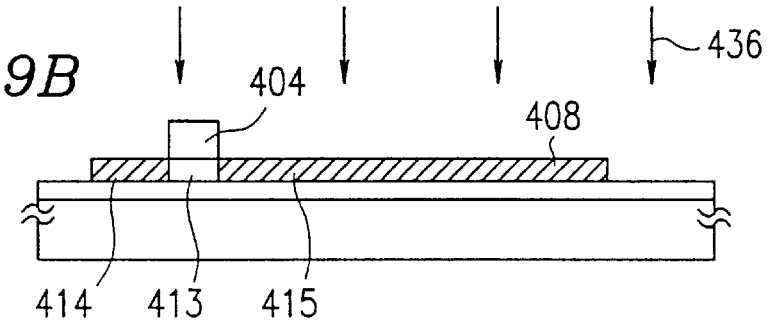
Figure 9C:
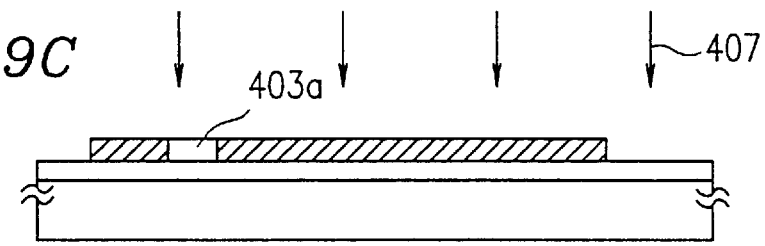
Figure 9D:
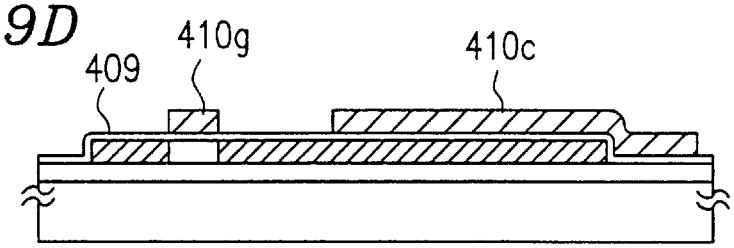
Figure 9E:
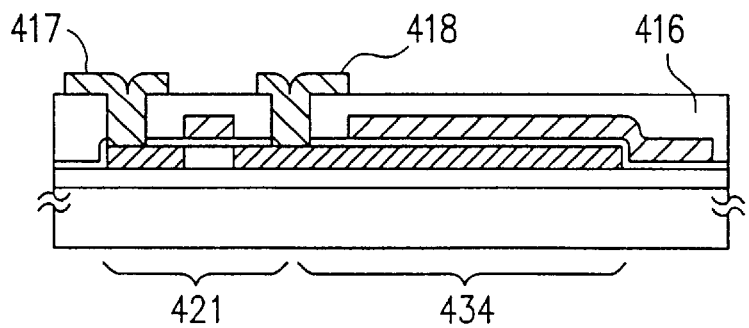

The structure of the active matrix substrate is illustrated together with a method for fabricating it with reference to FIGS. 9A to 9E. First, as shown in FIG. 9A, a base film 402 comprising $SiO_2$ and having a thickness of approximately 300 nm is formed on a glass substrate 401 by, for example, a sputtering method. The $SiO_2$ film 402 is provided so as to prevent the impurities of the glass substrate 401 from diffusing.

Then, an amorphous Si (a-Si) film 403 having a thickness of about 20 to 100 nm, for example, about 30 nm is formed on the $SiO_2$ film 402 by a reduced pressure CVD method, a plasma CVD method, and the like.

Then, as shown in FIG. 9B, an undesired portion of the a-Si film 403 is removed by any suitable method so as to form an island-like a-Si film 408 constituting an active region (a source region, a drain region and a channel region) of the TFT and a lower electrode of the storage capacitor Cs.

Subsequently, a photoresist is applied onto the island-like a-Si film 408, and exposed and developed to form a photoresist mask 404. Specifically, only a portion which constitutes a channel region 427 of the TFT is covered with the mask 404. Then, an impurity (e.g., phosphorus) is doped into the active region by an ion doping method using the photoresist mask 404 as a mask. Phosphine ($PH_3$) is used as the doping gas, and the accelerating voltage is about 5 to 30 kV, for example about 15 kV, and the doping amount is about $1\times10^{15}$ to $8\times10^{15}$ $cm^{-2}$, for example about $2\times10^{15}$ $cm^{-2}$. According to this step, the region into which the impurity is doped constitutes a source region 414, and the other region into which the impurity is doped constitutes a continuous region 415 including the drain region of the TFT 421 and the lower electrode of the storage capacitor Cs 434. The region 413 which is masked by the photoresist mask 404 and into which no impurity is doped constitutes a channel region 427 of the TFT 421 as discussed above.

When the substrate is viewed from the top, it is as shown in FIG. 8. That is, each TFT 421 and the storage capacitor Cs 434 are disposed on the same line at an equal interval (i.e., the laser scanning pitch P) in the scanning direction 424 of the subsequent laser irradiation. In the present embodiment, the arrangement interval Xp of the TFT is set to be 100 μm.

Thereafter, the photoresist mask 404 is removed. If the above-described a-Si film 403 is formed by a plasma CVD method, or if the above-described doping step is conducted without any mass separation, then the a-Si film 403 contains a large amount of hydrogen, and thus it is necessary to conduct a dehydrogenation treatment before the laser crystallization. This dehydrogenation treatment may be conducted by annealing the a-Si film at approximately 450° C. for several hours.

Then, as shown in FIG. 9C, a laser pulse 407 irradiates to crystallize the island-like a-Si film 408. The laser beams that can be used include an XeCl excimer laser (having a wavelength of 308 nm and a pulse width of 40 nsec). The laser pulse 407 irradiates at an energy density of about 200 to 350 mJ/cm$^2$, for example about 300 mJ/cm$^2$, while heating the substrate to about 200 to 500° C., for example about 400° C. at the time of the irradiation. The laser pulse 407 is successively scanned in the direction 424 as shown in FIG. 8. The laser pulse 407 is shaped with a homogenizer so that the beam on the substrate surface has a slender rectangle shape (e.g., 150 mm×1 mm), and its short side direction is the scanning direction. Because the overlapping amount of the laser beam is set to be 90%, the laser scanning pitch P is 100 μm, and any one point of the a-Si film 403 is subjected to the laser irradiation ten times each. Since the arrangement interval Xp of the island-like a-Si film 408 comprising the TFT active region and the storage capacitor Cs in the laser scanning direction 424 is set to be 100 μm, it is the same as the laser scanning pitch P. According to this step, the a-Si film 403 is heated to a temperature higher than its melting point, and fused and solidified so as to form a crystalline Si film 403a having good crystallinity, and so as to activate the impurity in the continuous region 415 including the drain region and the lower electrode of the storage capacitor Cs and reduce the resistance of the continuous region 415. As a result, the sheet resistances of the source region 414 and the continuous region 415 which are actually measured is 200 to 800 Ω/□. Then, as shown in FIG. 9D, a SiO$_2$ film having a thickness of about 20 to 150 nm, about 100 nm in the present embodiment is formed as a gate insulating film 409 so as to cover the above-described island-like crystalline Si film. In the present embodiment, the SiO$_2$ film is formed by using TEOS as a starting material, and decomposing and depositing it together with oxygen at a substrate temperature of about 300 to 400° C. by an RF plasma CVD method. After the formation of the film, the gate insulating film 409 is annealed at about 400 to 600° C. for several hours under an inert gas atmosphere in order to improve bulk property of the gate insulating film 409, and the interface property between the crystalline Si film and the gate insulating film.

Subsequently, an Al film having a thickness of about 300 to 600 nm, for example about 400 nm is formed by a sputtering method. Then, the Al film is patterned by any suitable method to form a gate electrode 410g and an upper electrode 410c of the storage capacitor Cs 434. In the active matrix substrate, the gate electrode 410g is formed from the n-th gate bus line, and the upper electrode 410c of the storage capacitor Cs is formed from the (n-th+1) gate bus line.

Then, as shown in FIG. 9E, a silicon dioxide film having a thickness of about 500 nm is formed as an interlayer insulating film 416. The silicon dioxide film is formed using TEOS as a starting material by a plasma CVD method together with oxygen, or by a reduced pressure CVD method or an ordinary pressure CVD method together with ozone. The interlayer insulating film thus formed has excellent coating property with respect to an uneven surface.

Then, contact holes are formed in the interlayer insulating film 416 by any suitable method, and a source electrode 417 and a drain electrode 418 are formed by any suitable method. The source electrode 417 is formed using a metal material (such as a two-layer film of TiN and Al). In this case, the TiN film is provided as a barrier film for the purpose of preventing Al from diffusing into the semiconductor layer. Moreover, a pixel electrode (not shown) is formed using a transparent conductive film such as ITO film.

Finally, they are annealed, for example, at about 350° C. under one atmospheric pressure of hydrogen for approximately one hour to complete an N-type TFT 421 and a storage capacitor 434 as shown in FIG. 9E. The annealing treatment provides hydrogen atoms at the interface between the active region of the TFT 421 and the gate insulating film to reduce unpaired bonding which deteriorates the TFT characteristics. In order to protect the TFT 421, the TiN film may optionally be formed by a plasma CVD method using SiH$_4$ and NH$_3$ as starting gases to cover the prescribed location of the TFT.

Each TFT which is actually fabricated according to the above-described steps has excellent characteristics and a field-effect mobility of 40 to 80 cm$^2$/Vs, and a threshold voltage of 1.5 to 3 V in all the fabricated panels. The TFTs in the panel have excellent uniformity and having a field-effect mobility difference of approximately ±5%, and a threshold voltage difference of ±0.2 V or less, although there is some variation in the TFT characteristics among different panels within the above-described ranges. Furthermore, when the surface roughness of the channel region 413 of the TFT 421 and the lower electrode 415 of the storage capacitor Cs 434 is measured by an interatomic force microscope (AFM), an average surface roughness Ra is 4 to 7 nm for the channel region 413, and 6 to 9 nm for the lower electrode 415 of the storage capacitor Cs. Moreover, because the channel region and the lower electrode are similarly crystallized in each panel, each of the channel region 413 and the lower electrode 415 of the storage capacitor Cs provides substantially uniform Ra having extremely small variation of ±1 nm or less.

Then, a liquid crystal display panel is fabricated using the active matrix substrate fabricated according to the present embodiment, and the overall display is performed. As a result, stripe-shaped uneven display that had appeared in the conventional liquid crystal display panel is not recognized and a liquid crystal display device having high display quality can be obtained.

Embodiment 5

Still another preferred embodiment is illustrated with reference to FIG. 10, FIG. 11, FIGS. 12A to 12F, and FIGS. 13A to 13F. The present embodiment is a case where the present invention is applied to a driver monolithic-type active matrix substrate. In the present embodiment, the pixel TFT of the active matrix portion is composed of an N-type TFT. Moreover, a TFT element which constitutes a driver circuit portion is formed on the same substrate as the pixel TFT is formed. The following illustrates a CMOS circuit which is composed complementarily of an N-type TFT and a P-type TFT as the TFTs for the driver circuit.

Figure 10:
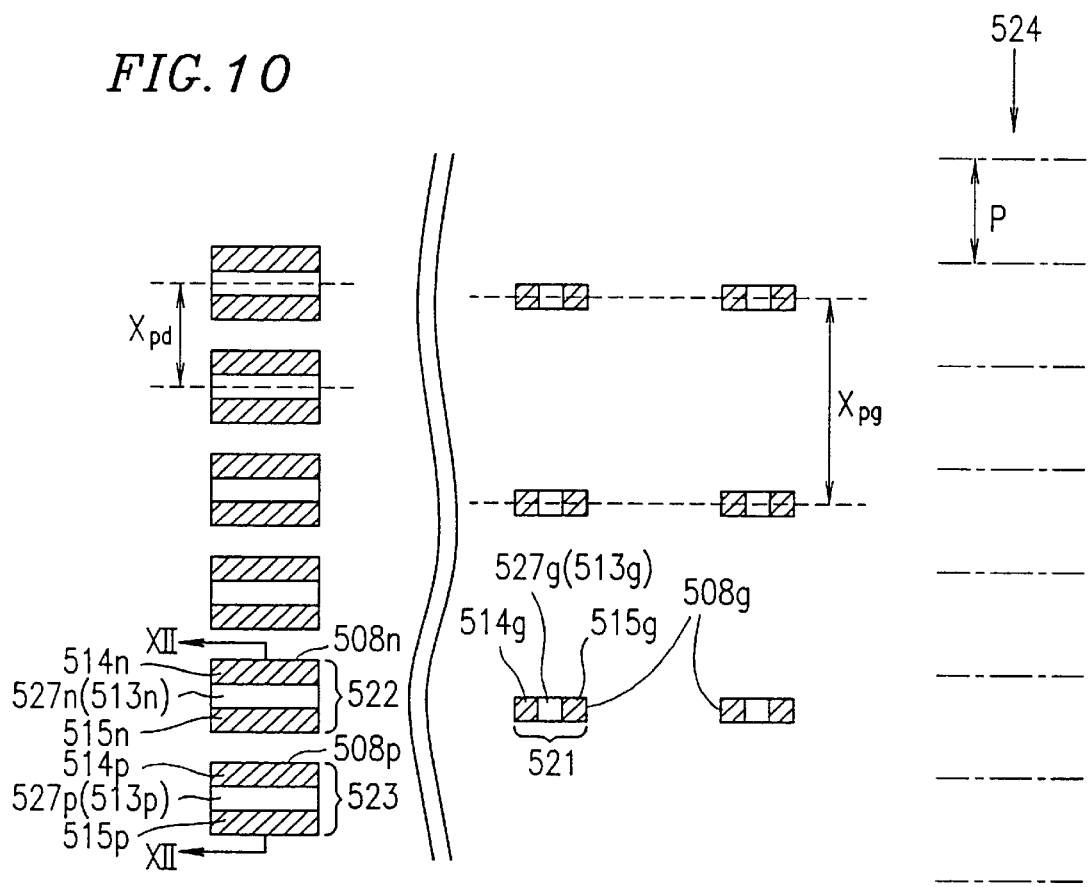
FIG. 10 is a schematic plan view of a driver monolithic-type active matrix substrate according to still another preferred embodiment of the present invention.
Figure 11:
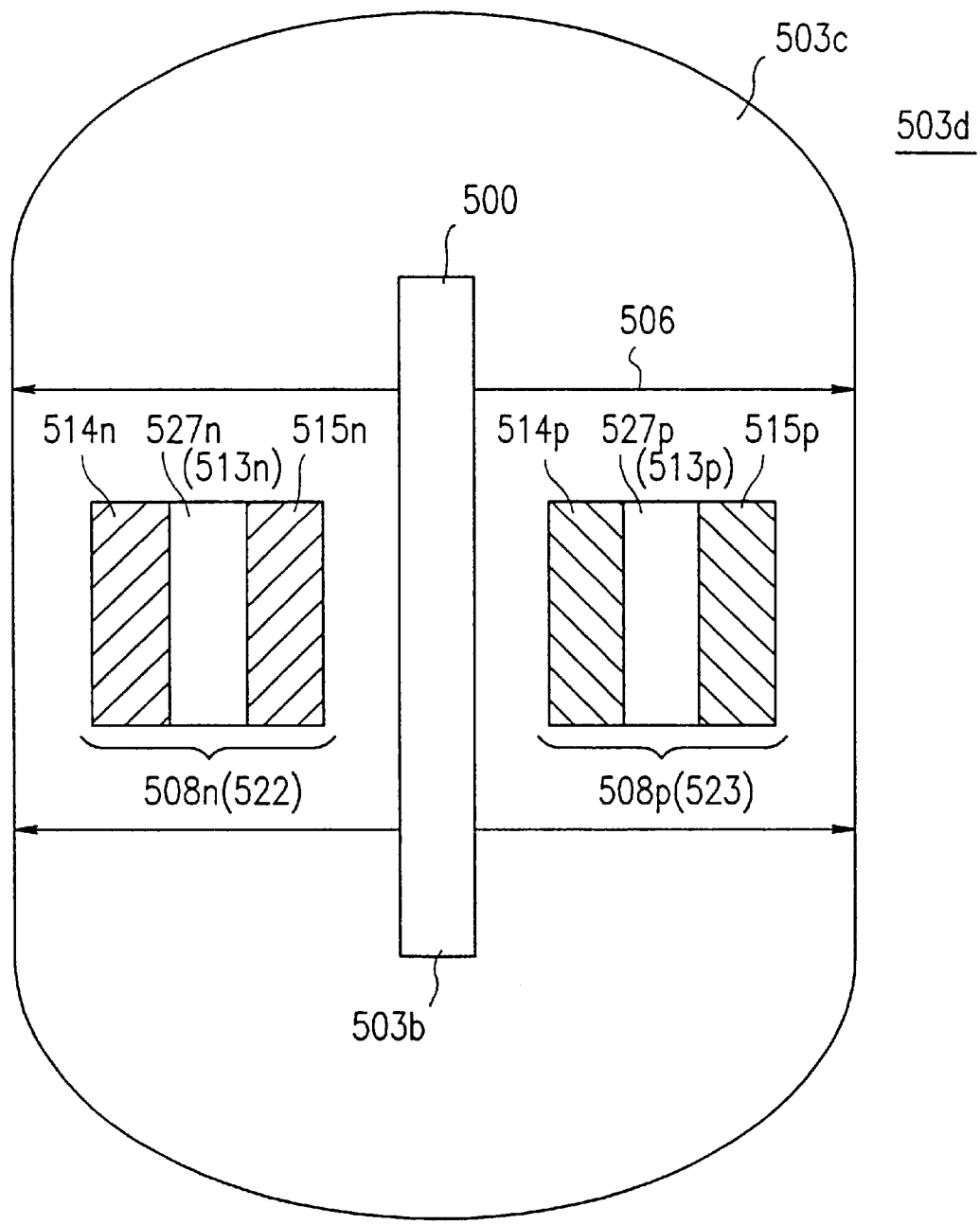
FIG. 11 is a schematic plan view for illustrating a method for fabricating a CMOS circuit which constitutes the driver circuit of the active matrix substrate of FIG. 10.

FIG. 10 is a schematic plan view of the driver monolithic-type active matrix substrate; FIG. 11 is a schematic plan view for illustrating a method for fabricating a CMOS circuit constituting the driver circuit; FIGS. 12A to 12F are schematic sectional views for illustrating a method for fabricating the CMOS circuit, and sectional views taken along the XII—XII line of FIG. 10; and FIGS. 13A to 13F are schematic sectional views for illustrating a method for fabricating the pixel TFT.

Figure 12A:
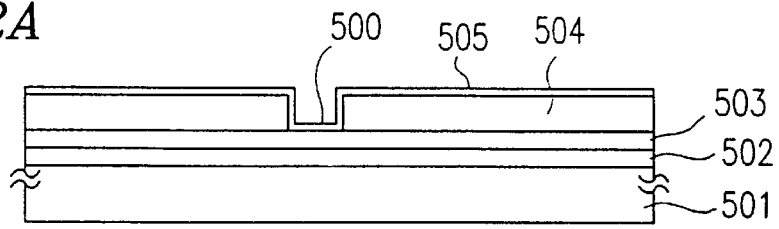
FIGS. 12A to 12F are schematic sectional views for illustrating a method for fabricating a CMOS circuit, which are sectional views taken along the line XII—XII of FIG. 10.
Figure 12B:
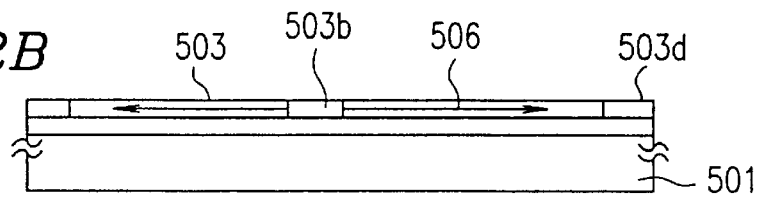
Figure 12C:
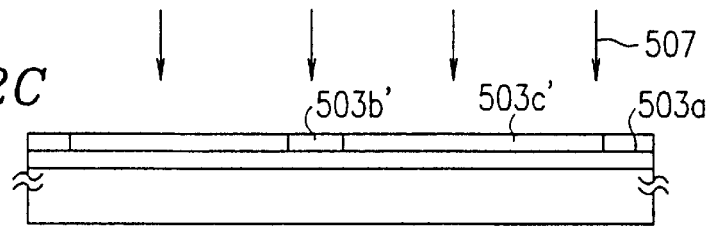
Figure 12D:
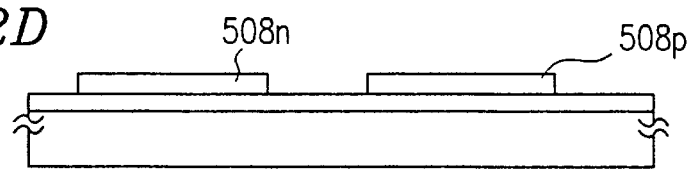
Figure 12E:
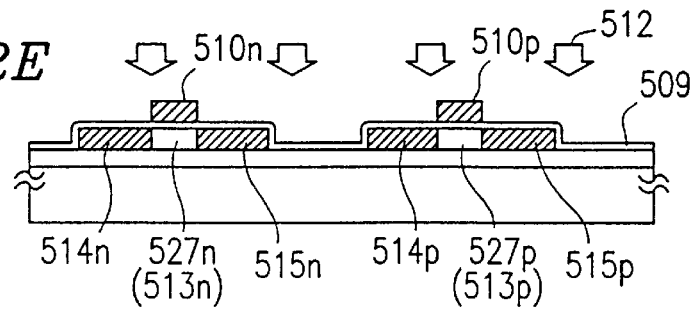
Figure 12F:
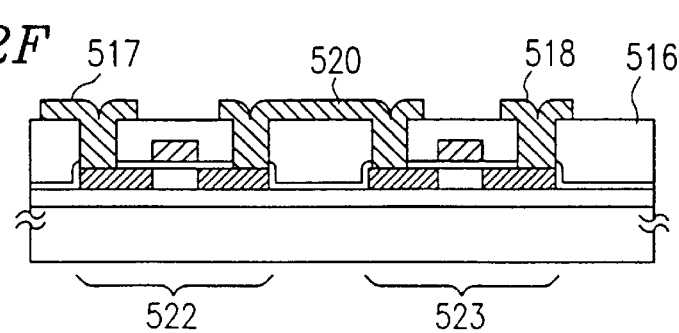

As shown in FIG. 10, the CMOS circuit of the driver monolithic-type active matrix substrate is composed of a plurality of N-type TFTs 522 and P-type TFTs 523 on the substrate, and its finished sectional structure is shown in FIG. 12F. FIG. 13F shows the finished sectional structure of the pixel TFT of the driver monolithic-type active matrix substrate. The following illustrates the structure of the semiconductor device as well as a method for fabricating it.

Figure 13A:
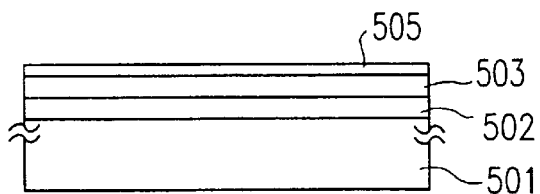
FIGS. 13A to 13F are schematic sectional views for illustrating a method for fabricating the pixel TFT of the active matrix substrate of FIG. 10.

First, as shown in FIGS. 12A and 13A, a base film 502 comprising SiO$_2$ and having a thickness of approximately 300 nm is formed on a glass substrate 501 by, for example, a sputtering method. The $SiO_2$ base film 502 is provided so as to prevent the impurities contained in the glass substrate 501 from diffusing. Then, an intrinsic (I-type) amorphous Si (a-Si) film 503 having a thickness of about 20 to 100 nm, for example, about 50 nm is formed by a reduced pressure CVD method, a plasma CVD method, or the like.

Then, a photosensitive resin (e.g., photoresist) is applied onto the a-Si film 503, and exposed to light and developed so as to form a photoresist mask 504. The a-Si film 503 is exposed in a slit shape in the region 500 by the throughhole of the photoresist mask 504 in the CMOS circuit portion. When the substrate of FIG. 12A is viewed from the top, the a-Si film 503 is exposed in a slit shape in the region 500 as shown in FIG. 11, and the other portions are masked by the photoresist. Furthermore, the photoresist mask 504 on the a-Si film 503 is all removed in the pixel TFT portion so that the entire surface of the a-Si film 503 is exposed, as shown in FIG. 13A.

Then, as shown in FIGS. 12A and 13A, a catalyst element such as nickel is deposited on the thus-fabricated substrate 501 so as to form a catalyst element film 505. In the present embodiment, the thickness of the catalyst element (nickel) film 505 is adjusted to approximately 1 nm or less by making the distance between the deposition source and the substrate greater than usual to reduce the deposition rate. The surface density of the catalyst element (nickel) film 505 which is actually measured is approximately $1 \times 10^{13}$ atoms/cm$^2$. In a CMOS circuit as shown in FIG. 12A, the catalyst element (nickel) film on the mask 504 is lifted off by removing the photoresist mask 504. As a result, a slight amount of the catalyst element (such as nickel) is selectively added to the a-Si film 503 in the region 500. On the other h and, a slight amount of the catalyst element is added to the entire surface of the a-Si film 503 in a pixel TFT portion as shown in FIG. 13A. Then, the a-Si film is crystallized by annealing, for example, at a temperature of about 550° C. for about 8 hours under an inert atmosphere.

Figure 13B:
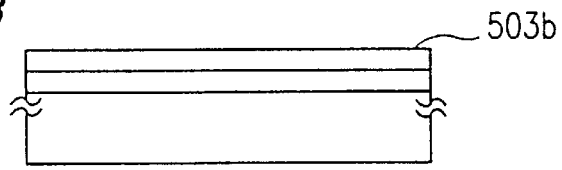

As shown in FIGS. 12B and 13B, this crystallization of the a-Si film 503 proceeds in the direction vertical to the substrate 501 using as a nucleus a catalyst element which has been added to the surface of the a-Si film 503, so as to form a crystalline Si-film 503*b*. In the CMOS circuit portion of FIG. 12B, the crystallization in the vertical direction only occurs in the region 500 to which a catalyst element is selectively added. Then, the crystal is grown in the horizontal direction (the direction parallel to the substrate) from the region 500 to a region surrounding the region 500 as indicated by the arrow 506 in FIGS. 11 and 12B, so as to form a horizontally grown crystalline Si film 503*c*. The other regions in the a-Si film 503 remain as an amorphous Si film region 503*d*. In the present embodiment, the size of the grown crystal in the direction parallel to the substrate is approximately 40 μm.

Figure 13C:
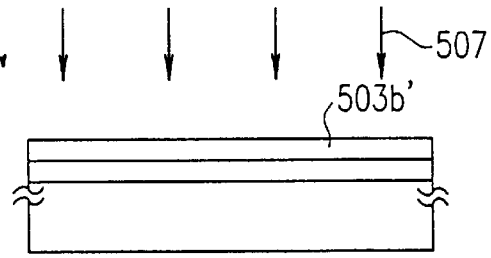
Figure 13D:
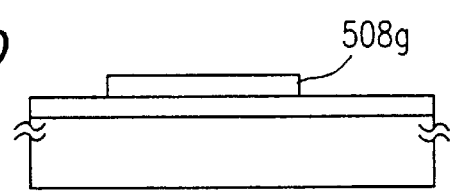

Thereafter, as shown in FIGS. 12C and 13C, a laser pulse 507 irradiates to recrystallize the Si film 503. The laser beams that can be used include an XeCl excimer laser (having a wavelength of 308 nm and a pulse width of 40 nsec). The laser pulse 507 irradiates an energy density of about 200 to 350 mJ/cm$^2$, for example about 320 mJ/cm$^2$, while heating the substrate to about 200 to 500° C., for example about 400° C., at the time of the irradiation. The laser pulse 507 is shaped with a homogenizer so that the beam on the substrate surface has a slender rectangle shape (e.g., 150 mm×1 mm), and is successively scanned in the direction vertical to its longer side, i.e., the laser scanning direction 524 of FIG. 10. In the present embodiment, the overlapping amount of the beam in the successive scanning is set to be 95%. Therefore, the scanning pitch P in FIG. 10 is 50 μm, and any one point of the a-Si film 503 is subjected to the laser irradiation twenty times each. According to this step, the crystalline Si film regions 503*b* and 503*c* are heated to a temperature higher than their melting points, and fused and solidified to be recrystallized films 508*n* and 508*p* which constitute an active region of the TFT of the CMOS circuit is designed to be 50 μm, and the arrangement interval Xpg of the island-like crystalline Si film 508g which constitutes an active region of the pixel TFT is designed to be 100 μm. That is, in the present embodiment, the arrangement interval Xpd of the TFT in the driver circuit (CMOS circuit) is designed to be the same as the laser scanning pitch P, and the arrangement interval Xpg of the pixel TFT is designed to be twice as much as the laser scanning pitch P. Since the layout of the driver circuit is independent of the arrangement interval of the pixel TFT, a driver circuit having higher integrity can be formed in any type of active matrix substrate. In FIG. 10, the symbols 521, 522 and 523 denote each TFT, and 527, 514 and 515 denote its channel region, source region and drain region, respectively.

Figure 13E:
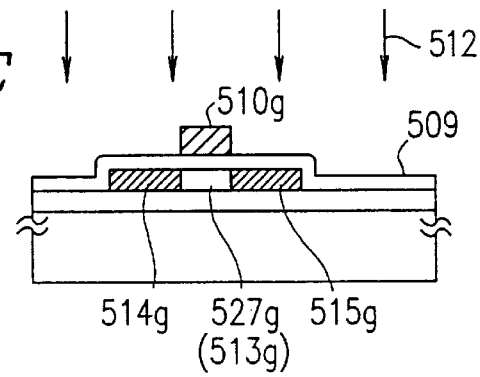
Figure 13F:
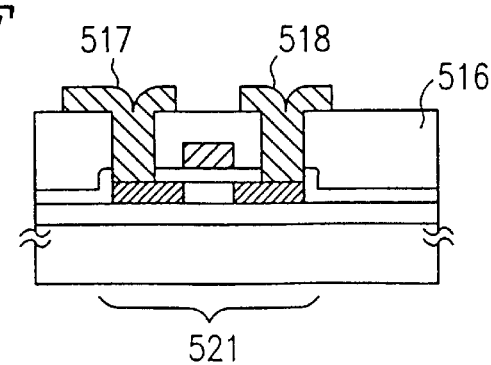

Then, as shown in FIGS. 12E and 13E, a silicon dioxide film having a thickness of about 100 nm is formed as a gate insulating film 509 so as to cover the above-described crystalline Si films 508*n* and 508*p* which constitute an active region. In the present embodiment, the silicon dioxide film is formed by using using a portion thereof as a seed crystal and to form Si film regions 503*b*' and 503*c*' having better crystallinity. The a-Si film region 503*d* is crystallized to form a crystalline Si-film 503*a*.

Thereafter, in the CMOS circuit portion, the prescribed portion of the crystalline Si film is removed by etching and patterned into a high quality and island-like crystalline Si film 503*c*' region which constitutes active TFT regions (element regions) 508*n* and 508*p*, as shown in FIGS. 11 and 12D. In the pixel TFT, as shown in FIG. 13D, the prescribed portion of the crystalline Si film is removed by etching and patterned into a high quality and island-like crystalline Si film 508*g* which constitutes an active region of the TFT. When the substrate 501 is viewed from the top, the island-like crystalline Si film 508*g* which constitutes an active region for each TFT is disposed as shown in FIG. 10. As can be seen from FIG. 10, in the present embodiment, the arrangement interval of the island-like crystalline Si film 508 (508*n*, 508*p* and 508*g*) in the laser light scanning direction 524 is different between the driver circuit portion and the pixel portion. Actually, the arrangement interval Xpd of the island-like crystalline Si TEOS as a starting material, and decomposing and depositing it together with oxygen at a substrate temperature of about 300 to 400° C. by an RF plasma CVD method. Preferably, after the formation of the film, the gate insulating film 509 is annealed at about 400 to 600° C. for several hours under an inert gas atmosphere in order to improve bulk property of the gate insulating film 509 as well as the interface property between the crystalline Si film and the gate insulating film 509.

Subsequently, an Al (containing about 0.1 to 2% of silicon) film having a thickness of about 400 to 800 nm, for example about 500 nm is formed by a sputtering method, as shown in FIGS. 12E and 13E. Then, the Al film is patterned by any suitable method to form gate electrodes 510*n*, 510*p* and 510*g*.

Then, impurities (e.g., phosphorus (P) and boron (B)) are doped into the island-like crystalline Si films 508*n*, 508*p* and 508*g* which constitute an active region by an ion doping method using the gate electrodes 510*n*, 510*p* and 510*g* as a mask. Phosphine ($PH_3$) and diborane ($B_2H_6$) are used as the doping gas. The accelerating voltage is about 60 to 90 kV, for example about 80 kV for P, and is about 40 to 80 kV, for example about 65 kV for B. The doping amount is about $1\times10^{15}$ to $8\times10^{15}$ cm$^{-2}$, for example about $2\times10^{15}$ cm$^{-2}$ for P and is about $5\times10^{15}$ cm$^{-2}$ for B. According to this step, the regions 513n, 513p and 513g, which are masked by the gate electrodes 510n, 510p and 510g and into which no impurity is doped, constitute TFT channel regions 527n, 527p and 527g. In the doping operation, each impurity is selectively doped by covering the undesired region with a photoresist. As a result, an N-type impurity source region 514n and drain region 515n, and a P-type impurity source region 514p and drain region 515p are formed, so as to complete an N-channel type TFT 522 and a P-channel type TFT 523, as shown in FIGS. 12E and 12F. When the substrate is viewed from the top, as shown in FIG. 11, the crystal growth direction (as indicated by the arrow 506) in the island-like crystalline Si films 508n and 508p is parallel to the carrier moving direction (i.e., from the source to the drain direction). This arrangement provides a TFT having higher mobility.

In the fabrication of the pixel TFT 521 as shown in FIGS. 13E and 13F, a source region 514g and a drain region 515g into which N-type impurity is doped are formed simultaneously with forming an N-type impurity region of the N-type TFT 522 of the CMOS circuit.

Thereafter, as shown in FIGS. 12E and 13E, they are annealed by the irradiation with a laser beam 512 to activate the impurities which have been tonically doped. The laser beams that can be used include an XeCl excimer laser (having a wavelength of 308 nm and a pulse width of 40 nsec), and each location is irradiated with four shots of the laser beam at an energy density of about 250 mJ/cm$^2$.

Subsequently, as shown in FIGS. 12F and 13F, a SiO$_2$ film having a thickness of about 600 nm is formed as an interlayer insulating film 516 by a plasma CVD method using TEOS as a starting material. Then, contact holes are formed on the interlayer insulating film, and a TFT source electrode 517, a source/drain electrode 520 and a drain electrode 518 are formed using a metal material (such as a two-layer film of TiN and Al). Moreover, a pixel electrode is formed in the pixel TFT using a transparent conductive film such as ITO film. Finally, they are annealed for example at 350° C. for approximately one hour under one atmosphere of hydrogen to complete an N-type TFT 522, a P-type TFT 523 which constitute a CMOS circuit, and a pixel TFT 521.

Each of the TFTs in the CMOS circuit fabricated according to the above-described steps has excellent characteristics and having a field-effect mobility of 120 to 180 cm$^2$/Vs for the N-type TFT and 70 to 100 cm$^2$/Vs for the P-type TFT, and a threshold voltage of 0 to 1 V for the N-type TFT and −2 to —3V for the P-type TFT. The field-effect mobility of the pixel TFT is 80 to 140 cm$^2$/Vs and the threshold voltage thereof is approximately 1 to 2 V. The TFTs in the panel have excellent uniformity and having a field-effect mobility difference of approximately ±5%, and a threshold voltage difference of ±0.2 V or less, although there are some variations in the TFT characteristics among different panels within the above-described ranges.

Then, a liquid crystal display panel is fabricated by using the driver monolithic-type active matrix substrate fabricated according to the present embodiment, and the overall display is performed. As a result, no stripe-shaped uneven display that appears to be caused by the successive laser scanning is recognized and a liquid crystal display device having high display quality can be obtained.

Although the embodiments of the present invention are specifically illustrated above, the present invention is not limited to these embodiments, and various modifications (for example, those described below) are applicable based on the technological concept of the present invention.

Embodiments 1 and 2 illustrate only two cases where a relationship between a laser pulse scanning direction and a TFT channel direction is either parallel or vertical. These two cases are the simplest and the most easily understood, since a relationship between a TFT channel length $X_L$ and a laser scanning pitch P may be set when the scanning direction is parallel to the channel direction, and since a relationship between a TFT channel width $X_W$ and a laser scanning pitch P may be set when the scanning direction is vertical to the channel direction. However, the present invention is also applicable to, for example, a case where the laser pulse scanning direction is oblique to the TFT channel direction, which also provides excellent effects according to the present invention (i.e., much less unevenness of the crystallinity among the TFTs). In this case, the maximum length of the channel region of the TFT in the laser scanning direction may be set as a channel size defined by the present invention.

In Embodiments 1 to 5, although an a-Si film is crystallized or a solid phase crystal growth silicon film is recrystallized using an XeCl excimer laser, any suitable pulse laser may be used for the crystallization or recrystallization. For example, the same effects can be attained using a KrF excimer laser having a wavelength of 248 nm, and the like.

Although Embodiments 2 and 5 employ a crystallization method using a catalyst element (i.e., an element accelerating the crystallization) in a solid phase crystal growth step, the same effect can be attained by any suitable solid phase crystal growth method without using such a catalyst element. Moreover, the crystal is grown in the horizontal direction by selectively doping a catalyst element in Embodiment 2, but a crystal growth method may be used in which the catalyst element is not selectively doped, but doped into the entire surface of the Si film. In this case, an excellent effect is derived from the catalyst element, and also the method is simplified because of the lack of the necessity of a mask formation step.

Moreover, Embodiments 4 and 5 employ a crystal growth method comprising adding a slight amount of nickel by forming a nickel thin film on the surface of the a-Si film by deposition as a method for doping a catalyst element (for example, nickel). However, the crystal growth may be conduced by doping nickel on the base film prior to the formation of the a-Si film, and diffusing the nickel from the lower layer of the a-Si film (i.e., from the base film). That is, the crystal growth may be made either from the upper side or from the lower side of the a-Si film. Various procedures may be used as a method for doping nickel. For example, the procedures include a method for applying an aqueous solution comprising a nickel salt dissolved therein; or a method for diffusing a SOG (spin-on-glass) material comprising a nickel salt dissolved therein; a method for forming a thin film by a sputtering method or a metal plating method; and a method for directly doping nickel by an ion doping method. The catalyst elements other than nickel that can suitably be used include cobalt (Co), palladium (Pd), platinum (Pt), copper (Cu), silver (Ag), gold (Au), indium (In), tin (Sn), aluminum (Al) and antimony (Sb).

An active matrix-type substrate for a liquid crystal display device has been mainly illustrated as a preferred embodiment of the present invention, but the present invention is also applicable to, for example, adhesion-type image sensors, built-in driver-type thermal heads, built-in driver-type light writing devices and display devices having an organic EL element as an emission element, three-dimensional ICs, and thin film integrated circuits. According to the present invention, these devices having high performance (e.g., high speed, high resolution) can be obtained. The present invention is widely applicable to semiconductor processing (e.g., processing of bipolar transistors and electrostatic induction transistors using a crystalline semiconductor as an element material, in addition to the MOS-type transistors illustrated in the above-described embodiments).

The following illustrates the functions of the present invention.

According to one aspect of the present invention, the semiconductor device includes a plurality of TFTs in which the channel region of the TFT comprises a crystalline Si film crystallized by the successive irradiation with a laser pulse in a scanning pitch P, and the size Xs of the channel region in the laser pulse scanning direction and the scanning pitch P of the laser pulse have a relationship approximately equal to Xs=nP (wherein n is an integer of 1 or more). Due to such a relationship between the size Xs of the channel region of the TFT and the scanning pitch P of the laser pulse, the channel region in each TFT contains all the possible crystallinity distributions in the scanning pitch P of the laser pulse along the laser pulse scanning direction. For example, with reference to the above-discussed FIG. 14B, every TFT channel region is crystallized to include the same crystallinity distribution (i.e., the difference in the crystallinity at the locations a to d). Therefore, although the channel region of each TFT has a crystallinity distribution, the crystallinity distribution is identical and thus each TFT has the same crystallinity. As a result, it is possible to eliminate the unevenness of the characteristics among the TFTs. Thus, the present invention is not intended to provide the uniformity of the characteristics among the TFTs by preparing a uniform crystalline Si film, but to accept the non-uniformity (crystallinity distribution) of the crystalline Si film obtained by the laser pulse scanning and then to accomplish the uniformity of the characteristics among the TFTs by utilizing its periodicity. When a liquid crystal display device is actually fabricated according to the present invention, and the characteristic uniformity of the pixel TFT is evaluated, excellent characteristic uniformity among the TFTs is obtained so as to prevent display defects resulted from the scanning of the laser pulse. Therefore, according to the present invention, the remarkable improvement of the characteristic uniformity among a plurality of TFTs can provide a semiconductor device having high performance and excellent reliability as well as stability.

The present invention is especially effective for applications requiring the characteristic uniformity of a plurality of TFTs. The typical example is an active matrix substrate for a liquid crystal display device. Since the quality (i.e., the uniformity of the TFT) of a liquid crystal display device is actually judged by the human eye, an extremely high uniformity in the element characteristics is required for the pixel TFT. The use of the present invention in the pixel TFT of a liquid crystal display device will significantly improve a uniformity among the TFTs. As a result, it is possible to prevent the display defects (for example, contrast unevenness) of a liquid crystal display device and thus to accomplish a liquid crystal display device having excellent display quality.

In a driver monolithic-type active matrix semiconductor device having a pixel TFT arranged in a matrix shape and a driver circuit driving the pixel TFT on the same substrate, a plurality of the TFTs which constitute the driver circuit (especially, a shift resister circuit), as well as the pixel TFT, require an extremely high characteristic uniformity. This is because the unevenness in the TFT characteristic of the driver circuit provides a different driving wave in each line, which results in the formation of a stripe-shaped uneven display on the screen. Since human eyes are very accurate and have a capability of distinguishing even a slightly uneven display, an excellent characteristic uniformity is required for the TFT so as to reduce the uneven display to the level that the uneven display is not recognized by human eyes. When the present invention is applied to a driver monolithic-type active matrix semiconductor device, the channel regions of the TFTs which constitute the driver circuit have a crystallinity distribution that results from the laser pulse scanning, but the channel region of each TFT has the same crystallinity. Therefore, excellent characteristic uniformity in the overall TFTs can be obtained. As a result, the characteristics of the driver circuit driving the pixel TFT will be stabilized so as to reduce defects such as uneven display that result from the unevenness of the characteristics in the driver circuit of the liquid crystal display device. Moreover, since a driver monolithic-type active matrix semiconductor device having high performance, high integrated and characteristically uniform TFTs which constitute the driver circuit can readily be obtained at a lower cost, it is possible to provide a compact, high performance and less expensive module.

In a preferred embodiment, the size Xs of the TFT channel region in the laser pulse scanning direction and the scanning pitch P of the laser pulse are approximately the same, i.e., have a relationship approximately equal to Xs=P. This is because it is necessary to irradiate the substrate in the maximum pitch in view of throughput, since the irradiation number of the laser pulse is increased as the area of the substrate is increased. In the case where the size Xs of the TFT channel region and the successive scanning pitch P of the laser pulse have a relationship approximately equal to Xs=P, a semiconductor device having a substrate of larger area can be suitably obtained. Although a process margin is increased in the present invention with the increase of the number of n, it is observed that the best results are obtained when n=1 (i.e., Xs=P) in the actual experiments.

Actually, a ratio Xs/P in the range of $0.9<Xs/P<1.1$ provides excellent results. This fact is based on the results obtained from the actual experiments made by the present inventors. Specifically, when the present invention is applied to the pixel TFT of an active matrix substrate for a liquid crystal display device which most strictly requires the characteristic uniformity of the TFT, and the display thereof (for example, uneven contrast) is visually observed by the present inventors, the ratio within this range greatly prevents the uneven display. That is, when a relationship between the size Xs of the channel region and the scanning pitch P has approximately ±10% or less deviation from Xs=P, a liquid crystal display device having excellent qualities can be obtained as with the case where Xs=P.

The first method for fabricating the semiconductor device of the present invention comprises forming an amorphous Si film on a substrate, crystallizing the Si film by successively irradiating the Si film with a laser pulse in a scanning pitch P, and patterning the crystallized Si film so as to form a TFT element region. The patterning is conducted so that the scanning direction of the laser pulse is vertical to the channel direction of the TFT (the carrier moving direction, i.e., a direction from the source region to the drain region), and the channel width $X_W$ of the resulting TFT and the scanning pitch P of the laser pulse have a relationship approximately equal to $X_W=nP$. In the second method for fabricating the semiconductor device of the present invention, the patterning is conducted so that the scanning direction of the laser pulse is parallel to the channel direction of the TFT, and the channel length $X_L$ of the resulting TFT and the scanning pitch P of the laser pulse have a relationship approximately equal to $X_L = nP$.

The third method for fabricating the semiconductor device of the present invention comprises forming an amorphous Si film on a substrate, patterning the Si film so as to form a TFT element region, and crystallizing the patterned Si film by successively irradiating the Si film with a laser pulse in a scanning pitch P. The patterning is conducted so that the scanning direction of the laser pulse is vertical to the channel direction of the TFT (the carrier moving direction, i.e., a direction from the source region to the drain region), and the channel width of the resulting TFT is $X_W$. The irradiation with the laser pulse is conducted so that the channel width $X_W$ and the scanning pitch of the laser pulse P have a relationship approximately equal to $X_W = nP$. In the fourth method for fabricating the semiconductor device of the present invention, the patterning is conducted so that the scanning direction of the laser pulse is parallel to the channel direction of the TFT, and the channel length of the resulting TFT is $X_L$. The irradiation with the laser pulse is conducted so that the channel length $X_L$ and the scanning pitch P have a relationship approximately equal to $X_L = nP$.

As is understood from the comparisons between the first method and the second method or between the third method and the fourth method, the relationship between the channel size (for example, the channel length, the channel width) and the scanning pitch can suitably be set, depending upon the relationship between the TFT channel direction and the scanning direction. Actually, it is possible to irradiate with the laser pulse so that the TFT channel direction is neither vertical nor parallel (for example, oblique) to the laser pulse scanning direction. For example, a semiconductor device having excellent TFT characteristic uniformity can be obtained by defining the relationship between the maximum length of the channel region in the channel direction and the pitch of the laser pulse. However, in view of the layout of the element (TFT) or the space utility and structure of the laser annealing apparatus, it is preferred that the TFT channel direction be either vertical or parallel to the laser pulse scanning direction.

With respect to the fabrication procedure, the patterning of the Si film is conducted after irradiation with the laser pulse in the first and second methods, and the patterning of the Si film is conducted before irradiation with the laser pulse in the third and fourth methods. Since the patterned and island-like Si film is irradiated with the laser in the third and fourth methods, the edge portion of the island-like region has less heat loss than the center portion thereof at the time of the crystallization of the Si film. As a result, the crystal grains are grown larger in the edge portion of the island-like region (i.e., the edge portion of the island-like region has excellent crystallinity). Therefore, the TFTs prepared by the third and fourth methods have better crystallinity of the channels than those prepared by the first and second methods. Therefore, TFTs having excellent characteristics (for example, improved ion characteristics, and therefore about 20% improved field-effect mobility) can be obtained. On the other hand, the TFTs prepared by the third and fourth methods have a larger surface unevenness in its edge portion. As a result, these TFTs have poorer reliability than those prepared by the first and second methods. Therefore, it is preferred to suitably select the above-described first, second, third or fourth method, depending upon the types of the intended semiconductor devices.

In a preferred embodiment, the amorphous Si formed on the substrate can be crystallized at a solid phase by heating. This is because such a solid phase crystallized Si film has good crystallinity uniformity and therefore is effective as a seed crystal at the time of the irradiation with the laser. (However, the solid phase crystallized Si film itself has poor crystallinity and is not suitable as a channel region of the TFT). When the solid phase crystallized Si film is irradiated with a laser pulse, the Si film is recrystallized using the solid phase crystals as a seed crystal. Since the solid phase crystallized Si film has good uniformity, the Si film is recrystallized while maintaining its excellent uniformity. Therefore, a crystalline (recrystallized) Si film having excellent uniformity is obtained so as to provide a semiconductor device having excellent characteristic uniformity among the TFTs.

Preferably, the solid phase crystallization is conducted after the doping of a catalyst element (i.e., an element accelerating the crystallization) into an amorphous Si film. The use of the catalyst element enables the reduction of the heating temperature, the shortening of the treatment time, and the improvement of the crystallinity in the resulting Si film. For example, the crystallization is completed at 550° C. for approximately 4 hours by doping a slight amount of a metal element such as Ni (nickel), Pd (palladium) and the like into the surface of the amorphous Si film and thereafter heating it. On the other hand, a thermal treatment at 600° C. or higher over several tens of hours is required for an ordinary solid phase crystallization without using any catalyst element. Moreover, a crystal grain obtained by the crystallization with the catalyst element has a network structure of a number of column crystals, and the inside of each column crystal is substantially a single crystal state, while a crystal grain obtained by an ordinary solid phase crystal growth method has a twin crystal structure. That is, while the Si film crystallized by an ordinary solid phase growth method tends to have many crystal defects, the Si film crystallized with the catalyst element has excellent crystallinity.

The crystalline Si film obtained by the crystallization with the catalyst element can be well recrystallized by irradiation with a laser pulse, due to the following reason: The solid phase crystallized Si film is recrystallized while maintaining the crystallinity of the solid phase crystallized crystal. Therefore, the crystalline Si film obtained by the solid phase crystallization without using any catalyst element may provide a crystalline Si film having many crystal defects due to the twin crystal structure of the original crystal. On the other hand, a crystalline Si film obtained by the solid phase crystallization with the catalyst element has column crystals bonding each other in each crystal grain obtained by the recrystallization with the laser pulse irradiation, and has excellent crystallinity over the entire film.

Preferably, the catalyst element is selectively doped into a prescribed portion of the amorphous Si film. The region into which the catalyst element is doped is preferentially crystallized when the Si film is heated. Then, a crystal growth may occur from the region into which the catalyst element is doped toward its surrounding region in the horizontal direction (the direction parallel to the substrate). The inside of the horizontally crystal grown region has a number of mono-directionally grown column crystals, and has better crystallinity than a region randomly crystallized with a catalyst element randomly doped thereinto. Therefore, a higher performance semiconductor device is obtained by using the horizontally crystal grown portion of the crystalline Si film for a channel region of the TFT. In this case, if the TFT is designed so that the horizontal crystal growth direction of the Si film is substantially parallel to the carrier moving direction of the TFT, the crystal boundary does not exist in the carrier moving direction. Therefore, a TFT having a higher mobility can be obtained due to the reduction of the probability that the carrier is obstructed at the crystal boundary.

The catalyst elements that can be used in the present invention include Ni, Co, Pd, Pt, Cu, Ag, Au, In, Sn, Al, and Sb. These elements provide a crystallization accelerating effect in a slight amount. Ni is especially preferred due to the following reason: Although a catalyst element itself does not contribute to the crystal growth of the Si film, it contributes to the crystal growth by bonding to Si of the Si film to form a silicide. It is believed that the silicide crystal acts as a kind of mold at the time of the crystallization of the amorphous Si film so as to accelerate the crystallization of the amorphous Si film. In this case, Ni forms a silicide, $NiSi_2$, with two Si's. $NiSi_2$ has a fluorite-type crystal structure, and the crystal structure is very similar to a diamond structure of a single crystal silicon. Furthermore, $NiSi_2$ has a lattice constant of 0.5406 nm, which is very close to 0.5430 nm (a lattice constant of the diamond structure of a crystal silicon). As described above, since $NiSi_2$ is excellent as a mold for crystallizing the amorphous Si film, Ni is most preferred as a catalyst element used in the present invention.

A preferred laser pulses used in the present invention include those having a wavelength of 400 nm or less. The use of such a laser pulse can effectively impart its energy to the Si film due to a large absorption coefficient of the Si film in its wavelength range. As a result, an excellent crystalline Si film is obtained with much less thermal damages to the lower layers such as glass substrate and the like. XeCl excimer laser beam having a wavelength of 308 nm is especially preferred. The excimer laser beam is very suitable for annealing a Si film used for a large area substrate, because the beam size thereof can be suitably enlarged due to its higher oscillation output as well as higher beam stability.

Preferably, the laser pulse is shaped so that the beam on the substrate surface has a slender rectangle shape. It is preferred that a laser pulse be successively scanned in a direction vertical to the longer side direction of the rectangle so as to crystallize the TFT channel region. Since the beam has a relatively better uniformity in a direction vertical to the scanning direction during the scanning and irradiation with the laser pulse, it is possible to efficiently obtain a plurality of TFTs having uniform characteristics, which are used for a larger substrate, by expanding the beam size toward this direction.

According to another aspect of the present invention, the semiconductor device includes a plurality of TFTs in which the channel region of the TFT comprises a crystalline Si film crystallized by the successive irradiation with a laser pulse in a scanning pitch P, and the arrangement interval Xp of the channel region in the laser pulse scanning direction and the scanning pitch P have a relationship approximately equal to Xp=nP (wherein n is an integer of 1 or more). Due to such a relationship between the arrangement interval Xp of the channel region of the TFT and the scanning pitch P of the laser pulse, the channel region of each TFT in the laser pulse scanning direction is crystallized by the same energy portion of the energy profile of the laser pulse. For example, with reference to the above-discussed FIG. 14A, when a certain TFT is crystallized with an energy at a location a, all the TFTs are crystallized with an energy at the location a; when a certain TFT is crystallized with an energy at a location d, all the TFTs are crystallized with an energy at the location d. Thus, the present invention is not intended to provide the characteristic uniformity among the TFTs by preparing a uniform crystalline Si film, but to accept the non-uniformity (crystallinity distribution) of the crystalline Si film obtained by the laser pulse scanning and then to accomplish the characteristic uniformity among the TFTs by utilizing its periodicity. Moreover, unlike the technology described in Japanese Laid-open Patent Publication No. 7-92501, the present invention does not require a precise location control of the laser pulse due to the following reason: According to the technology described in the above-described publication, each TFT should be crystallized using the best portion of the energy profile of the laser pulse (i.e., around the peak of the energy profile). In contrast, according to the present invention, it is not possible to determine which portion of the energy profile of the laser pulse is used for crystallizing the TFT, but each TFT is crystallized using the same portion of the energy profile of the laser pulse (for example, if a certain TFT is crystallized with an energy at a location a, all the TFTs are crystallized with an energy at the location a). Therefore, a precise location control of the laser pulse for irradiating the Si film with around the peak of the energy profile of the laser pulse is not required in the present invention. The TFT crystallized with the energy at the location a of FIG. 14A has poorer element characteristics than the TFT crystallized with the energy at the location d, but has excellent characteristic uniformity, because all the TFTs are crystallized with the same energy (i.e., the energy at the location a). When a liquid crystal display device is actually fabricated according to the present invention and the characteristic uniformity of the pixel TFT is evaluated, excellent characteristic uniformity among the TFTs is obtained so as to prevent stripe-shaped display defects resulted from the scanning of the laser pulse. Therefore, according to the present invention, the remarkable improvement of the characteristic uniformity among a plurality of TFTs can provide a semiconductor device having high performance and excellent reliability and stability.

When the present invention is applied to an active matrix substrate for a liquid crystal display device, the semiconductor device comprises a plurality of TFTs driving a pixel electrode and a storage capacitor connected parallel to the pixel capacitor of the TFTs on a substrate having an insulating surface. Both the TFT channel region and one of the electrodes of the storage capacitor comprise a crystalline Si film crystallized by the successive scanning irradiation with a laser pulse, wherein the arrangement interval Xp of the channel region is the same as the arrangement interval of the electrode portion of the storage capacitor, and the arrangement interval Xp and the scanning pitch P of the pulse laser beam have a relationship approximately equal to Xp=nP (wherein n is an integer of 1 or more). When a gate pulse signal to each pixel TFT is turned off in the liquid crystal display device, the voltage applied to the pixel liquid crystal capacity will be reduced by the capacity coupling of the parasitic capacity of MOS-TFT and the pixel liquid crystal capacity. Usually, a storage capacitor Cs is provided parallel to the pixel liquid crystal capacitor in order to lower the reduction of the voltage, and the voltage applied to the pixel capacitor is adjusted by varying the voltage of the opposite substrate by the aforementioned reduction of the voltage. Preferably, the lower electrode of the storage capacitor Cs is formed from a Si film which constitutes the TFT channel region, the capacitor component is formed from a gate insulating film of the TFT, and the upper electrode is formed from a gate electrode of the TFT. This structure allows the formation of a larger capacitor in a smaller area, and as a result, a liquid crystal display panel having higher aperture ratio can be obtained.

The lower electrode of the storage capacitor is formed by crystallizing the Si film by the successive scanning of the laser pulse in the same manner as the TFT channel region, and has an uneven surface. The capacity of each storage capacitor Cs as well as the reduction amount of the voltage has heretofore been diverse due to the surface roughness. Thus, only a portion of the reduced voltage has been adjusted, and an uneven display such as flicker has occurred in a nonadjusted portion. In contrast, since the lower electrode of each storage capacitor Cs is crystallized with the same portion of the energy profile of the laser pulse according to the present invention, the lower electrode of each storage capacitor Cs in one substrate has almost the same surface roughness. Therefore, since the capacity of each storage capacitor Cs in the liquid crystal display device is almost the same, the reduction amount of the voltage is the same, which result in the prevention of display defects such as flicker. Additionally, while the storage capacitor has a good characteristic uniformity inside the panel (i.e., in the same substrate), the storage capacitor may have a different capacity as well as a different reduction amount of the voltage among different panels due to the features of the present invention. However, in this case, it is possible to optimally adjust the voltage in the opposite substrate of each panel so as to adjust a reduction amount of the voltage among different panels without causing any problems. As described above, the non-uniformity among the TFTs due to the scanning of the laser pulse can be significantly improved by applying the present invention to an active matrix substrate for a liquid crystal display device. Therefore, a liquid crystal display device having excellent display quality can be obtained without any uneven display resulted from the laser pulse scanning. Furthermore, according to the present invention, a liquid crystal display device having such excellent display quality can be obtained by a simple, less expensive process.

In a driver monolithic-type active matrix semiconductor device having a pixel TFT arranged in a matrix shape and a driver circuit driving the pixel TFT on the same substrate, the channel region of the pixel TFT and a plurality of TFTs which constitute the driver circuit comprise a crystalline Si film crystallized by the successive scanning of the laser pulse. The channel region of the driver TFT is, as with the channel region of the pixel TFT, arranged by an interval Xp in the laser pulse scanning direction, and this arrangement interval Xp and a scanning pitch P of the laser pulse have a relationship approximately equal to Xp=nP (wherein n is an integer of 1 or more). Thus, because the channel region of a plurality of the TFTs which constitute the driver circuit is crystallized under the same condition, a semiconductor device having excellent characteristic uniformity is obtained in the overall driver TFTs. As a result, the characteristics of the driver circuit driving the pixel TFT are stabilized so as to reduce display defects (for example, uneven display) resulted from the variation in the characteristics of the driver circuit in the liquid crystal display device. Unlike the technique described in Japanese Laid-open Patent Publication No. 7-92501, it is not necessary to dispose both the pixel TFT and the driver TFT on the same line according to the present invention. In other words, the pixel TFT and the driver TFT may be disposed on a different line, so long as the pixel TFT and the driver TFT are periodically arranged in the laser pulse scanning direction by an interval Xp. According to the present invention, excellent characteristic uniformity in the overall pixel TFTs and the overall driver TFTs can be independently accomplished by disposing the pixel TFT and the driver TFT in the above-described manner. As a result, a driver monolithic-type active matrix semiconductor device having high performance, high integrated and characteristically uniform TFTs which constitute the driver circuit can be obtained so as to provide a compact, high performance and less expensive module.

Furthermore, as is apparent from the above-description, the present invention is applicable to a case where the arrangement interval Xpg of the channel region of the pixel TFT and the arrangement interval Xpd of the channel region of the driver TFT are different in the laser pulse scanning direction. That is, satisfactory characteristic uniformity of the pixel TFT, and satisfactory characteristic uniformity of the driver TFT can be independently accomplished by setting each of the arrangement interval Xpg of the channel region of the pixel TFT and the arrangement interval Xpd of the channel region of the driver TFT and the laser pulse scanning pitch P so that they have relationships approximately equal to Xpg=nP (wherein n is an integer of 1 or more) and Xpd=mP (wherein m is an integer of 1 or more). Therefore, according to the present invention, since it is possible to dispose the driver TFT independent of the layout of the pixel TFT, a design margin of the element layout can be increased so as to accomplish a highly integrated driver circuit, compared to the technique described in Japanese Laid-open Patent Publication No. 7-92501 which requires to arrange the driver TFT and the pixel TFT on the same line with the same line numbers.

In a preferred embodiment, the ratio Xp/P is within the range of n−0.1<Xp/P<n+0.1 (wherein n is an integer of 1 or more). This is based on the results obtained from the actual experiments made by the present inventors with respect to an active matrix substrate for a liquid crystal display device which most requires the characteristic uniformity of the TFT. The details are as follows: An active matrix substrate for a liquid crystal display device especially requires the characteristic uniformity of the TFT between the adjacent pixels. However, since the liquid crystal display device obtained using the conventional pulse laser scanning often has non-uniform TFT characteristics between the adjacent pixels, a bright line or a dark line (i.e., line display defects) appears in the direction vertical to the laser scanning direction. The present invention is intended to reduce such line display defects by the reduction of the characteristic variation between the adjacent TFTs. According to the actual observation by the present inventors, when the crystallinity of the channel region is continuously varied over 10 lines or more of the pixel TFTs, only a slight uneven display appears and no such line display defects as described above appear in the liquid crystal display device. The continuous variation of the crystallinity of the channel region means the location of the energy profile of the laser used for the crystallization is gradually shifted in a manner that, for example, the TFT in the k-th line is crystallized with an energy at a location a of the energy profile of FIG. 14A and the TFT in the (k+1)th line is crystallized with an energy at a location b. The fact that the crystallinity of the channel region is continuously varied over 10 lines or more of the pixel TFTs means that one cycle of the deviation of the energy profile is over 10 lines or more of the pixel TFT lines (for example, when the TFT in the k-th line is crystallized with an energy at the location a of the energy profile, the next TFT crystallized with an energy at the location a is one in a line greater than the (k+10)th line. In other words, this means that the deviation from Xp=nP is less than 10%. Therefore, it is possible to eliminate such line display defects resulted from the laser scanning by setting Xp/P in the range of n−0.1<Xp/P<n+0.1 (wherein n is an integer of 1 or more), and thus a liquid crystal display device having high display quality is obtained.

Furthermore, when the crystallinity of the channel region is continuously varied over 20 lines or more of the pixel TFTs (i.e., when Xp/P is in the range of n−0.05<Xp/P<n+0.05 (wherein n is an integer of 1 or more)), even stripe-shaped display defects, which are slightly observed when Xp/P is in the range of n−0.1<Xp/P<n+0.1, do not appear. Therefore, a liquid crystal display device having a further excellent display quality is obtained by setting Xp/P in the range of n−0.05<Xp/P<n+0.05 (wherein n is an integer of 1 or more).

More preferably, the arrangement interval Xp of the channel region in the laser pulse scanning direction and the scanning pitch P of the laser pulse are approximately the same, i.e., have a relationship approximately equal to Xp=P. In this case, the largest process margin can be ensured, because the permissible range for the deviation of the laser crystallization condition is maximum. In view of the permissible range for the deviation, Xp/P may be preferably in the range of 0.9<Xp/P<1.1, and more preferably in the range of 0.95<Xp/P<1.05.

The fifth method for fabricating the semiconductor device of the present invention comprises forming an amorphous Si film on a substrate, crystallizing the Si film by successively irradiating the Si film with a laser pulse in a scanning pitch P, and patterning the crystallized Si film so as to form a plurality of thin film transistor element regions. The sixth method of the present invention comprises forming an amorphous Si film on a substrate, patterning the Si film in a manner that the arrangement interval of the TFT channel region is Xp in the subsequent laser pulse scanning direction, so as to form a TFT element region, and crystallizing the patterned Si film by successively irradiating the Si film with a laser pulse in a scanning pitch P. The patterning is conducted so that the arrangement interval Xp of the TFT channel region in the laser pulse scanning direction and the scanning pitch p have a relationship approximately equal to Xp=nP (wherein n is an integer of 1 or more). In the fifth method, the patterning of the Si film is conducted after the laser irradiation, while in the sixth method the patterning of the Si film is conducted before the laser irradiation. Since the patterned and island-like Si film is subjected to the laser irradiation in the sixth method, the heat loss in the edge of the island-like region is less than that in the center portion at the time of crystallizing the Si film. As a result, the crystal grains are grown larger in the edge portion of the island-like region (that is, the edge portion of the island-like region has excellent crystallinity). Therefore, the TFTs prepared by the sixth method have better crystallinity of the channel than those prepared by the fifth method. Accordingly, a TFT having excellent characteristics (for example, improved ion characteristics, and therefore about 20% improved field-effect mobility) can be obtained. On the other hand, the TFTs prepared by the sixth method have a larger surface unevenness in the edge portion. As a result, these TFTs are less reliable than those prepared by the fifth method. Therefore, it is preferred to suitably select the above-described fifth or sixth method, depending upon the types of the intended semiconductor devices.

When an active matrix substrate for a liquid crystal display device is fabricated according to the method for fabricating a semiconductor device of the present invention, one of electrodes of the storage capacitor connected to the TFT is patterned at an interval Xp in the scanning direction simultaneously with patterning the Si film. Thus, the storage capacitor component can be formed at the same time of forming the TFT without any additional step. Furthermore, since the lower electrode of each storage capacitor obtained by this method has a similar surface roughness, it is possible to reduce the unevenness of the storage capacitor, and thus to prevent uneven displays such as flicker in the resulting liquid crystal display device.

Figure 14A:
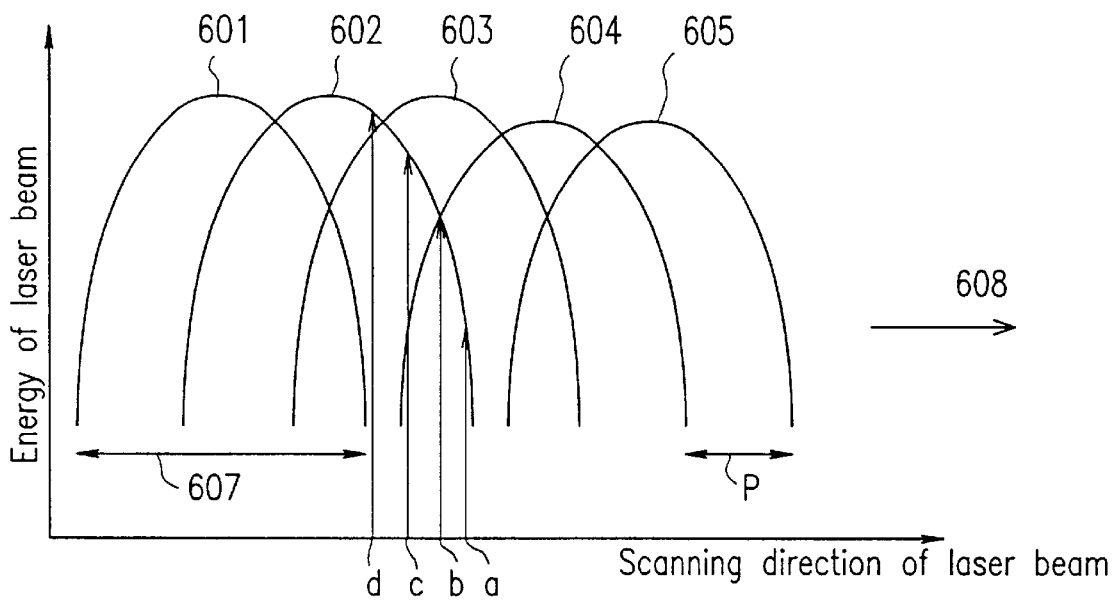
FIG. 14A is a schematic view for illustrating the energy distribution of the laser beam viewed from the cross section in the scanning direction of a laser pulse.
Figure 14B:
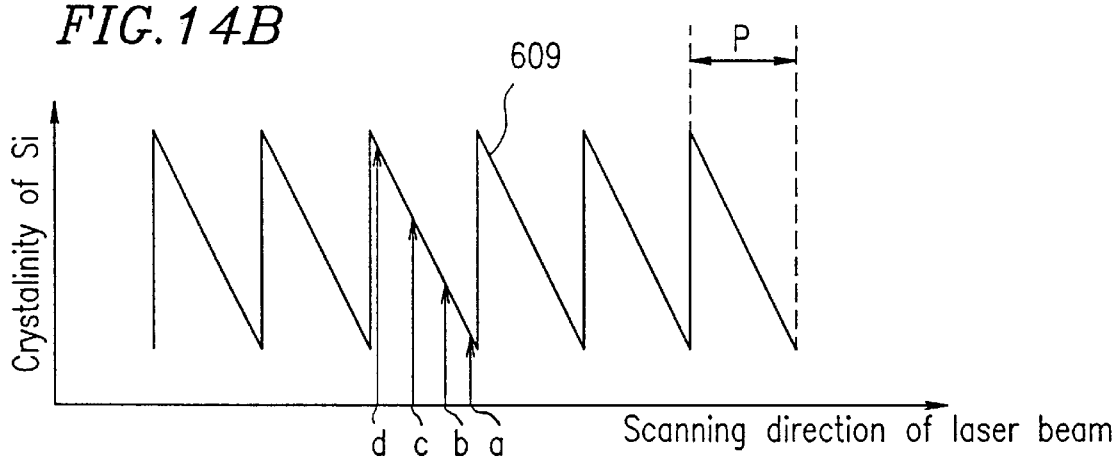
FIG. 14B is a schematic view for illustrating the crystallinity distribution of the crystalline Si film obtained by the successive scanning as shown in FIG. 14A.

In a preferred embodiment, the ratio P/Bw of the above-described laser pulse scanning pitch P to the beam width Bw of the laser pulse on the irradiated surface (the surface of the Si film) is 0.2 or less. In other words, the overlapping amount in the successive scanning of the pulse laser is 80% or more. Unlike the technology described in Japanese Laid-open Patent Publication No. 7-92501, the present invention does not require a precise location control of the laser pulse with respect to the channel region of the TFT. Therefore, for example, it is not sure which portion (for example, the locations a, b, c and d) of the energy profile of the laser pulse in FIG. 14A is used for crystallizing the Si film. Therefore, even when the Si film is crystallized with an energy profile portion that provides only an insufficient crystallinity (for example, the location a in FIG. 14A), it is necessary to ensure a performance that can withstand actual use. Specifically, it is necessary to ensure the characteristic uniformity of the TFT not only on the same panel (i.e., the same substrate), but among different panels. Generally, a smaller ratio P/Bw (a larger overlapping amount) of the laser pulse provides a further improved characteristic uniformity of the TFTs among the panels. When the characteristic uniformity of the TFT among the panels is actually observed by the present inventors while varying the P/Bw ratio (the overlapping amount), the variation in the field-effect mobility of the TFT exceeds about ±20% among the panels (24 samples) when a P/Bw ratio exceeds 0.2 (i.e., when the overlapping amount is less than 80%). In this case, the field-effect mobility difference of a panel having the maximum field-effect mobility is about two times as much as a panel having the minimum field-effect mobility. This variation may be unacceptable in view of the characteristic uniformity of a semiconductor device. Therefore, it is preferred that the ratio P/Bw of the laser pulse scanning pitch P to the beam width Bw of said laser pulse on the surface of the Si film be 0.2 or less.

More preferably, the ratio P/Bw is 0.1 or less, that is, the overlapping amount in the successive scanning of the pulse laser is 90% or more. This is because it is possible to further reduce the variation of the TFT characteristics among the panels, and to increase the design margin of the semiconductor device and the driving system thereof. Practically, the variation of the TFT characteristics among the panels is considered an error in view of the design of the semiconductor device and the driving system thereof if it is within ±10%, and it is not necessary to eliminate the variation. According to the actual experiments made by the present inventors, the variation of the TFT characteristics among the panels is actually reduced to ±10% or less by setting the P/Bw ratio to be 0.1 or less. Moreover, because the uniformity of the TFT characteristics among the panels is not much improved even when the P/Bw ratio is further reduced, a P/Bw ratio of 0.1 or less is considered to be the optimum range in the present invention.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor device comprising a plurality of thin film transistors on a substrate having an insulating surface, wherein a channel region of at least one of said thin film transistors comprises a crystalline Si film having a size Xs of said channel region aligned with a scanning direction of a pulse laser beam applied to crystallize the Si film, and said size Xs of the channel region is related to a scanning pitch P of said pulse laser beam by the relationship Xs=nP where n is an integer of 1 or more.

2. A semiconductor device according to claim 1, wherein said substrate is as active matrix substrate having the corresponding number of pixel electrodes to that of said thin film transistors, and each of said thin film transistors are a switchable connection to a corresponding one of said pixel electrodes.

3. A semiconductor device according to claim 1, wherein said substrate is a driver monolithic-type active matrix substrate having an active matrix portion and a driver circuit, and said thin film transistors constitute a switch for said active matrix portion and said driver circuit.

4. A semiconductor device according to claim 1, wherein said size Xs of said channel and said scanning pitch P have a relationship approximately equal to Xs=P.

5. A semiconductor device according to claim 4, wherein a ratio Xs/P of said size Xs of said channel region to said scanning pitch P is in the range of 0.9<Xs/P<1.1.

6. A semiconductor device comprising a plurality of thing film transistors on a substrate having an insulating surface, wherein a channel region of said thin film transistor comprises a crystalline Si film having an arrangement interval Xp of said channel region aligned with a scanning direction of a pulse laser beam the arrangement interval XP of said channel region applied to crystallize the Si film, and a scanning pitch P of said pulse laser satisfies a relationship where XP is approximately equal to nP where n is an integer of 1 or more, and P is a scanning pitch of said pulse laser beam.

7. A semiconductor device comprising a plurality of thin film transistors, wherein each thin film transistor of said transistors drive a pixel electrode and a storage capacitor connected in parallel to the pixel electrode, and said thin film transistor and storage capacitor are on a substrate having an insulating surface, wherein a channel region of said thin film transistor and an electrode of said storage capacitor comprise a crystalline Si film, and an arrangement interval Xp exists between said channel region of a first transistor and the channel region of an adjacent transistor in a scanning direction of a pulse laser beam applied to crystallize the transistors and the electrode of the storage capacitor, where the arrangement interval Xp satisfies a relationship approximately equal to Xp=nP, where P is a scanning pitch P of the pulse laser beam and n is an integer, and a second arrangement interval exists between the electrode in a storage capacitor associated with the first transistor and the electrode associated with the adjacent transistor wherein the second arrangement interval is equal to Xp.

8. A semiconductor device comprising a plurality of thin film transistors, wherein each of the transistors drive a pixel electrode and the transistors are on a substrate having an insulating surface, wherein the transistors each have channel regions formed of a crystalline Si film, and the channel regions are arranged in an arrangement interval Xp along a scanning direction of a pulse laser beam applied to crystallize the thin film transistors, and the arrangement interval Xp is equal to nP, where P is a scanning pitch of said pulse laser beam and n is an integer.

9. A semiconductor device according to claim 8, wherein an arrangement interval Xpg of the channel region of said thin film transistors driving said pixel electrodes and an arrangement interval Xpd of the channel region of said thin film transistors which constitute said driver circuit are different, and said arrangement intervals Xpg and Xpd and a scanning pitch P of said pulse laser beam have relationships approximately equal to Xpg=nP where n is an integer of 1 or more and Xpd=mP where m is an integer of 1 or more.

10. A semiconductor device according to claim 6, wherein a ratio Xp/P of said arrangement interval Xp of said channel region to said scanning pitch P of said pulse laser beam is in the range of n−0.1<Xp/P<n+0.1 where n is an integer of 1 or more.

11. A semiconductor device according to claim 10, wherein a ratio Xp/P of said arrangement interval Xp of said channel region to said scanning pitch P of said pulse laser beam is in the range of n−0.05<Xp/P<n+0.05 where n is an integer of 1 or more.

12. A semiconductor device according to claim 6, wherein said arrangement interval Xp of said channel region and said scanning pitch P of said pulse laser beam have a relationship approximately equal to Xp=P.

* * * * *